(12) United States Patent
Hinderling et al.

(10) Patent No.: US 10,006,766 B2
(45) Date of Patent: Jun. 26, 2018

(54) ELECTROOPTICAL DISTANCE MEASURING DEVICE AND DISTANCE MEASURING METHOD

(71) Applicant: HEXAGON TECHNOLOGY CENTER GMBH, Heerbrugg (CH)

(72) Inventors: Jürg Hinderling, Marbach (CH); Julien Singer, Berneck (CH)

(73) Assignee: HEXAGON TECHNOLOGY CENTER GMBH, Heerbrugg (CH)

( * ) Notice: Subject to any disclaimer, the term of this patent is extended or adjusted under 35 U.S.C. 154(b) by 349 days.

(21) Appl. No.: 14/857,577

(22) Filed: Sep. 17, 2015

(65) Prior Publication Data
US 2016/0084651 A1  Mar. 24, 2016

(30) Foreign Application Priority Data

Sep. 18, 2014 (EP) .................................. 14185404

(51) Int. Cl.
*G01C 3/08* (2006.01)
*G01S 7/481* (2006.01)
(Continued)

(52) U.S. Cl.
CPC ............. *G01C 3/08* (2013.01); *G01C 15/002* (2013.01); *G01S 7/4816* (2013.01);
(Continued)

(58) Field of Classification Search
CPC ....... G01C 3/08; G01S 7/4816; G01S 7/4817; G01S 7/4861; G01S 17/08; G01S 17/10; G01S 17/42
See application file for complete search history.

(56) References Cited

U.S. PATENT DOCUMENTS

| | | | | |
|---|---|---|---|---|
| 5,311,353 A | * | 5/1994 | Crawford | ................ H03F 3/087 359/333 |
| 6,603,534 B2 | * | 8/2003 | Seifert | ..................... G01C 3/08 356/3.08 |

(Continued)

FOREIGN PATENT DOCUMENTS

| | | |
|---|---|---|
| CN | 1646935 A | 7/2005 |
| CN | 1997911 A | 7/2007 |

(Continued)

OTHER PUBLICATIONS

European Search Report dated Mar. 11, 2015 as received in Application No. 14185404.

*Primary Examiner* — Eric L Bolda
(74) *Attorney, Agent, or Firm* — Maschoff Brennan

(57) ABSTRACT

Some embodiments of the invention relate to an electrooptical distance measuring device comprising light source, reception circuit comprising detector, in particular avalanche photodiode APD and control and evaluation component for deriving a distance to the target object. Some embodiments of the invention, the detector has at least two mutually independent reception segments for mutually independently generating a respective resultant electrical signal, wherein the reception segments are assigned to predefined or predefinable, in particular different, distance ranges to be measured. Furthermore, at least two independent amplifiers may be provided in the reception circuit. Some embodiments of the invention, therefore, for a reception segment which is assigned only to a lower distance range of comparatively near distances, an amplifier having a comparatively low gain factor can now be connected downstream, such that it is therefore possible as a result to avoid e.g. a rapid supersaturation even in the case of near distances.

20 Claims, 12 Drawing Sheets

(51) Int. Cl.
*G01S 7/486* (2006.01)
*H01L 31/107* (2006.01)
*H01L 31/10* (2006.01)
*G01S 17/42* (2006.01)
*G01C 15/00* (2006.01)
*G01S 17/08* (2006.01)
*G01S 17/10* (2006.01)

(52) U.S. Cl.
CPC .......... *G01S 7/4817* (2013.01); *G01S 7/4861* (2013.01); *G01S 17/08* (2013.01); *G01S 17/10* (2013.01); *G01S 17/42* (2013.01); *H01L 31/10* (2013.01); *H01L 31/107* (2013.01); *G01S 7/4868* (2013.01)

(56) References Cited

U.S. PATENT DOCUMENTS

| | | | |
|---|---|---|---|
| 7,236,235 B2 | 6/2007 | Dimsdale | |
| 7,583,373 B2 | 9/2009 | Schwarz | |
| 7,760,335 B2 | 7/2010 | Wolf et al. | |
| 8,773,642 B2* | 7/2014 | Eisele | G01C 3/08 356/3.01 |
| 8,908,157 B2 | 12/2014 | Eisele et al. | |
| 2006/0247526 A1 | 11/2006 | Lee et al. | |
| 2009/0059183 A1* | 3/2009 | Tejima | G01C 3/08 353/69 |
| 2011/0007328 A1 | 1/2011 | Wolf et al. | |
| 2012/0262696 A1* | 10/2012 | Eisele | G01C 3/08 356/4.01 |
| 2016/0265913 A1* | 9/2016 | Choiniere | G01C 3/08 |

FOREIGN PATENT DOCUMENTS

| | | |
|---|---|---|
| CN | 101398476 A | 4/2009 |
| CN | 102549381 A | 7/2012 |
| DE | 100 51 302 A1 | 4/2002 |
| DE | 10 2006 013290 A1 | 9/2007 |
| DE | 10 2007 053 852 A1 | 5/2009 |
| EP | 0 071 667 A1 | 2/1983 |
| EP | 1 329 739 A2 | 7/2003 |
| EP | 1 686 350 A1 | 8/2006 |
| EP | 1 879 044 A1 | 1/2008 |
| EP | 2 182 377 A1 | 5/2010 |
| WO | 03/083507 A1 | 10/2003 |
| WO | 20111029651 A1 | 3/2011 |

* cited by examiner

ELECTROOPTICAL DISTANCE MEASURING DEVICE AND DISTANCE MEASURING METHOD

FIELD OF THE INVENTION

The invention relates to a detector, in particular an avalanche photodiode, for an electrooptical distance measuring instrument, in particular in a laser scanner, laser tracker, profiler, LIDAR, theodolite or a total station, comprising a photosensitive reception component for receiving optical radiation and generating a resultant electrical signal.

BACKGROUND

The invention also relates to an assigned electrooptical assembly for receiving optical radiation and generating a resultant electrical signal for an electrooptical distance measuring instrument of the generic type.

Moreover, the invention relates to an electrooptical distance measuring instrument and distance measuring method using the detector according to the invention and the assigned electrooptical assembly.

For measuring a target point, a multiplicity of geodetic methods and geodetic instruments have been known since ancient times. In this case, distance and angle from a measuring instrument to a target point to be measured are recorded and, in particular, the location of the measuring instrument together with reference points possibly present are detected as spatial standard data.

Such measuring instruments are used for detecting three-dimensional objects or surfaces. In this case, these instruments typically progressively scan a three-dimensional structure, such as e.g. the structure of a construction site, using laser pulses and then calculate from the reflection pulses regained a corresponding three-dimensional model that describes the surface of the object.

One generally known example of such measuring instruments or geodetic instruments is a theodolite, a tachymeter or a total station, which is also designated as electronic tachymeter or computer tachymeter. One such geodetic measuring apparatus from the prior art is described in the publication document EP 1 686 350, for example. Such instruments have electrical-sensor-based angle and distance measuring functions that permit direction and distance to be determined with respect to a selected target. In this case, the angle and distance variables are ascertained in the internal reference system of the instrument and, if appropriate, also have to be combined with an external reference system for absolute position determination.

Apparatuses for optically scanning an environment that are embodied as laser scanners usually comprise a measuring head mounted on a base, said measuring head being rotatable relative to said base about a base rotation axis. In the measuring head, there are accommodated on one side a laser light source and a light sensor for the reception of reflected laser pulses, and also a transmission and reception optical unit and an exit opening that permits the radiation to emerge from or enter the housing. On the other side of the measuring head, opposite the exit opening, the measuring head has a rotary mirror for deflecting transmission light beam and reception light beam, said rotary mirror being rotatable about a rotation axis that is perpendicular to the base axis. The intersection point of the two rotation axes generally corresponds to the point of impingement of the transmission light beam on the rotary mirror, wherein the rotary mirror is generally arranged in a manner inclined by an angle of 45° with respect to the rotation axes. By rotating the measuring head about the base rotation axis and rotating the rotary mirror about the rotation axis, it is possible to carry out a three-dimensional scan.

In a different topology, the entire optical transmission and reception module is rotated instead of a rotary mirror. One example of such an arrangement is scanning theodolites.

Present-day distance measuring devices that are used in production such as theodolites, scanners, LIDAR systems ("light detection and ranging"), profilers, laser trackers, or else in automobiles, have the problem of handling a high signal dynamic range.

Furthermore, in some of these products, the sensor beam is pivoted at high speed by means of a deflection unit, in particular a scanner. In order that the reception beam reflected back from the target object impinges on the receiver, the latter has to be designed with a large field of view (FOV). Receivers having a large field of view have the disadvantage of shot rays in daylight or ambient light, however, which reduces the range and generates distance noise in distance measuring devices.

Distance measuring sensors for geodetic or industrial measuring instruments are almost exclusively equipped with an avalanche photodiode (APD) as detector having a temporal resolution in the picoseconds range. These APDs generally have a round reception area. APDs having reception areas covered with a mask, consisting of a plurality of openings, are also known.

All these avalanche photodiodes according to the prior art have a common sensitive photosensitive area situated under the mask. Just a single photocurrent is generated upon incidence of light.

APD arrays are also known. Such arrays have a matrixlike arrangement of sensor elements that are used for example for highly sensitive measurements for imaging object representation. In this case, the insensitive distance between the sensor elements is generally very large. Such arrays typically have the disadvantage of a small filling factor (<50%), and the number of pixels and corresponding signals increases with the square of the area, which makes the signal processing very complex and expensive. In conventional APDs, care is taken to ensure that crosstalk between the elements is as low as possible (typically <5%). In the case of the present invention, this requirement is not relevant to the solution of the problem addressed.

Conventional distance measuring apparatuses have to handle the high signal dynamic range. In this case, with the use of a single-area avalanche photodiode, the limits with regard to the current intensity handleable by the APD itself are reached and the reception electronics are also occasionally overdriven (supersaturation). In certain apparatuses, the emitted transmission power is adapted; in other apparatuses, the gain of the receiver is set; in still other apparatuses, a multi-channel receiver is used.

Optical fiber amplifiers connected downstream of the transmission source, for example embodied as a laser, LED, etc., are particularly suitable for setting the transmission power over a large range. However, such light amplifiers are not settable with microsecond intervals. However, present-day scanners measure at a point rate of at least one million points per second. By contrast, there are variable optical attenuators (VOA) which are settable with nanosecond speed; such components require correspondingly powerful driving and are expensive in comparison with the other customary components of a typical distance measuring instrument.

Furthermore, shadings of the reception light in the near range (e.g. <5 m) generally occur—principally in the case of receiver-end fixed-focus arrangements—in the case of known detector arrangements from the prior art. Said shadings have the effect that no signal at all is detected by the APD in a very near distance range of from 0 m to a certain limit distance. Therefore, the distance range within which targets are actually measurable or their distances are determinable is thus reduced.

SUMMARY

Some embodiments of the invention provide a distance measuring device comprising a detector, in particular an avalanche photodiode, that is improved with regard to signal dynamic range, signal-to-noise ratio and/or near-range receivability, for receiving optical radiation and generating a resultant electrical signal.

Some embodiments of the invention enable a reduction of the required signal dynamic range to be ensured and thus a reduction of complexity and costs of the apparatus and also to enable precise distance determinations and for targets in a short and also in a large distance range, in association with low complexity of the apparatus.

Some embodiments of the invention raise the signal strength for quite short distances for which only weak or even inadequate measurement light could previously be received as a result of shadings of the received beam.

Some embodiments of the invention facilitate a solution to the unambiguity problem that occurs in distance measurements if, within a measurement clock cycle, a plurality of light pulses are underway between a transmitter and a receiver, and to suppress distance measurements with respect to incorrect targets, which play a part in particular a problem in distance measurements with air-based LIDAR systems.

First subject matter of the invention is a detector, in particular a PIN diode or an avalanche photodiode, from a distance measuring instrument, in particular in a laser scanner, laser tracker, profiler, LIDAR, theodolite or a total station, comprising a photosensitive reception component for receiving optical radiation and generating a resultant electrical signal that permits a time interval determination in particular in the pico- or subpicoseconds range.

According to the invention, the detector or the reception component has at least two mutually independent reception segments (APD segments or PIN diode segments), which are assigned to predefined or predefinable, in particular different, distance ranges to be measured.

The two mutually independent reception segments are provided for mutually independently generating a respective resultant electrical signal and are embodied and arranged in a reception plane such that they are assigned to predefined or predefinable, in particular different, distance ranges to be measured.

Furthermore, at least two independent amplifiers, in particular having different gain factors, are also provided in the context of the reception circuit for the at least two reception segments.

As a result, the required detectable signal dynamic range which can be fulfilled by the sole available reception segment in the case of unsegmented detectors according to the prior art can advantageously be reduced to smaller necessary signal dynamic ranges which can be covered by the plurality of mutually independent reception segments according to the invention. Both the resulting requirements made of signal processing electronics and costs of the apparatus are thus reduced.

In particular, the mutually independent reception segments do not overlap and are in each case spaced apart from one another.

This facilitates a differentiation of the signals in a manner dependent on the distance to be determined with respect to a target object.

In accordance with one embodiment, the mutually independent reception segments are arranged in a radially distributed fashion, specifically in a concentric-circular fashion.

Such a configuration of the geometry of a detector according to the invention corresponds to the size distribution and/or spatial distribution of the impingement point or impingement spot (received light beam) of the reception light beams returning from the object to be measured.

In accordance with one specific embodiment, first segments are arranged centrally and further segments are arranged peripherally and axially symmetrically with respect to one another. Such a symmetrical, geometrical positioning of the segments is advantageous in the case of constructions where transmission and reception channels are constructed coaxially. In the case of biaxial arrangements of transmission and reception light beams in distance measuring instruments, an offset between optical axes of the transmission and reception light beams upon impingement on the detector should be expected. In the case of such arrangements, depending on the requirement made of the distance measuring instrument, both radially symmetrical and asymmetrical segment arrangements of the reception component are a solution.

In accordance with one embodiment, distances between adjacent reception segments are identical or different from one another, advantageously in particular for determining different distance ranges by means of different reception segments.

In accordance with one specific embodiment thin dedicated, in particular peripheral, reception segments are adapted in terms of their dimensioning for the reception of large-area received light spots for a determination of short distances to a target object.

The signal-to-noise ratio (SNR) of the assigned distance measurement signal of objects in near ranges is thus improved, in particular because a shading of central received light regions can be avoided since the assigned APD segment is positioned alongside the shading region.

A further aspect of the invention relates to the fact that a dedicated signal processing path, in particular respectively separate for different reception segments, is assigned to each reception segment.

In accordance with one embodiment of the electrooptical reception assembly according to the invention comprising a reception circuit, mutually different signal processing paths are separately electronically drivable and/or readable, in particular wherein signals from different reception segments are readable from assigned different signal paths in a manner distinguishable from one another. The signal paths can be controlled either by direct switching of the high voltage at the APD segments or by switching by means of external components such as transistors.

In particular, the gain of the signals from different reception segments in the assigned signal paths is chosen to be different, specifically regulatable separately from one another. This makes it possible e.g. that an amplifier having a comparatively high gain factor can be provided for a first reception segment, which is assigned to an upper distance range of comparatively far distances, and an amplifier having a comparatively low gain factor can be provided for a second reception segment, which is assigned to a lower distance range of comparatively near distances (with the result that overdriving can be avoided here even in the case of high-amplitude reception signals coming from short distances).

The last two embodiments mentioned therefore advantageously firstly enable an adaptation of the signals to be processed in the signal path to the signal amplitudes supplied by the associated reception segment. In particular, an optimization of the signal-to-noise ratio is also facilitated by an individual settability of the signal gain. Secondly, the separate readability of signals of different reception segments via assigned mutually different signal paths facilitates the assignment of the potential associated distance ranges to the target object, which is useful in the case of a solution to an ambiguity problem that potentially occurs during the distance determination (e.g. the "two-pulses-in-the-air" problem).

In accordance with a further embodiment of the electrooptical assembly according to the invention, the dimensioning of reception segments and of the gain in the associated signal paths is coordinated with one another and also with the respective return light signals to be expected from different distance ranges, in particular for a minimization of a resultant variation between strong and weak signals as signal dynamic range and/or magnification of a signal-to-noise ratio for the individual signal paths.

As a result, the requirements made of the signal processing electronics and thus the apparatus costs can be reduced further.

Even at a laser shot rate of 5 MHz, in the case of object distances of more than 30 m, there is more than one signal pulse in the air at the same time. By means of segmented APD (or segmented PIN diode) in which, by way of example, a first segment is assigned to the distance range of <30 m and a second segment is assigned to the distance range of >3 m, an unambiguous assignment of corresponding transmission to reception pulses can thus be made possible. A suitable APD segmentation would consist, for example, of a round inner sensor element (as the second segment) and, adjacent at the outer side, an annular sensor element (as the first segment). In this case, the outer annular first element/segment receives only reflected signals from objects from the first unambiguity range of <30 m and the inner sensor element/segment receives only reflected signals from objects from the range of >3 m. Such a solution to the ambiguity of a plurality of pulses between transmitter and receiver simplifies the transmission modulation. The transmission source is usually driven by means of known modulation techniques, such as frequency modulation, amplitude modulation (AFK), phase or time interval modulation (PSK, FSK) etc., in order to enable an unambiguous assignment of transmission and reception signal pulses during the signal evaluation, which according to the invention can now be obviated, if appropriate.

The reception segments can therefore—as illustrated in an exemplary fashion by the above example—be embodied and arranged according to the invention such that light signals backscattered from the different distance ranges illuminate different defined reception segment combinations (i.e. either only one determined reception segment for a defined distance range or a plurality of determined reception segments in an unambiguous combination or a defined distance range).

In the above example the situation would be as follows: reflected light signals from objects in the distance range of >30 m are detected only by the inner, second segment, reflected light signals from objects in the distance range of <30 m and >3 m are detected by both segments, and reflected light signals from objects in the distance range of <3 m are detected only by the outer, first segment.

The fact of which segment receives a light signal or which segments in corresponding combination respectively receive light signals can therefore already be used as a coarse distance estimator. If the signal strengths (or the signal strength distribution in the case of segment combinations) are then also used in each case, a coarse distance can be estimated even somewhat more accurately.

The distance measuring instrument according to the invention, in particular for a laser scanner, laser tracker, profiler, LIDAR, theodolite or a total station, is equipped here in detail with at least a light source for emitting at least one light signal as transmission light beam, in particular laser light, onto a target object, the reception circuit comprising a photosensitive detector as receiver for detecting a light signal backscattered from the target object as reception light beam, and a control and evaluation component for determining a distance to the target object.

As explained above, in this case the receiver is designed as a segmented detector/receiver for high electrical carrier frequencies (of e.g. between 100 MHz and 1 GHz), and the reception circuit comprises an electrooptical assembly according to the invention, in each case according to one of the abovementioned embodiments.

The present invention is relevant in particular to such distance measuring devices in which the transmission light beam is substantially collimated, that is to say has at most a divergence of 0.5°, specifically of 0.01°, and a focusing optical unit having a fixed focus is disposed upstream of the detector, in particular wherein the detector is positioned in the focal plane of the focusing optical unit (that is to say is focused to infinity).

In accordance with one embodiment of the electrooptical distance measuring instrument according to the invention, the transmission light beam and the reception light beam are arranged coaxially with respect to one another.

In accordance with a further embodiment, the transmission light beam and the reception light beam are arranged biaxially with respect to one another.

By virtue of the fact that a dedicated signal processing path, in particular respectively separate for different reception segments, is assignable to each reception segment, electronic crosstalk of signals from different reception segments can moreover be at least reduced, and in the best case even completely prevented.

In principle, however, electronic crosstalk of a received light pulse among a plurality of APD segments is not necessarily disturbing. A number of possibilities are appropriate for a distance determination. By way of example, only the time signal of the segment which has the largest pulse amplitude (SNR) can be evaluated. However, it is also possible for the electronically amplified signals from a plurality of segments to be combined and then fed to an analog-to-digital converter to a real-time signal evaluation unit (FGPA), and, finally, for the distance to be determined algorithmetically. On the other hand, the distribution of the signal strengths of all the signal channels assigned to the APD segments can additionally also be assessed. Diverse parameters of the arrangement between the distance measuring instrument and the at least one target object can be ascertained therefrom. By way of example, a coarse estimation of distance can be derived in order to achieve an unambiguous pulse assigned if a plurality of light pulses are underway simultaneously between transmitter and receiver. This obviates the customary pulse coding or signal modulation such as are known from telecommunications applications. A plurality of light pulses between transmitter and receiver, at fast transmission pulse rates, can already be handled starting from medium distances. At a measurement rate of 5 MHz, in the case of object distances of greater than 30 m, two light pulses are already underway in the air.

A further subject matter of the invention is an electrooptical distance measurement method comprising at least emitting a light signal as transmission light beam, in particular laser light, from a light source onto a target object, detecting a portion of the emitted light pulse returning from the target object as reception light beam by means of a detector as receiver and signal processing electronics connected downstream of the detector, and determining a distance to the target object by means of a control and evaluation component.

According to the invention, the receiver is embodied as a segmented detector, and the reception circuit comprises an electrooptical assembly according to the invention, in each case according to one of the abovementioned embodiments.

In accordance with one embodiment of the method according to the invention, signals from different reception segments of the segmented detector according to the invention are read from assigned different signal paths in a manner distinguishable from one another, and a distance to the target object is unambiguously determined from the comparison of signals of these different reception segments, in particular taking account of an ascertained size and/or shape of a received light spot.

In accordance with a further embodiment of the method according to the invention, in particular using a LIDAR system, signals from different reception segments of the segmented detector are read from assigned different signal paths in a manner distinguishable from one another, and a distance determination with respect to incorrect targets, in particular as a result of light scattering at air particles (caused e.g. by aerosols, dust, clouds, fog, snowfall), is prevented by exclusion of predefined or predefinable minimal distances.

In accordance with a further embodiment of the method according to the invention, in particular as a result of rapid pivoting of the laser beam generated radial offset of the received light spot from the optical axis, signals from different reception segments of the segmented detector are read from assigned different signal paths in a manner distinguishable from one another, and a coarse distance determination is carried out in a first step of the data evaluation and a fine distance determination is carried out in a second step.

BRIEF DESCRIPTION OF THE DRAWINGS

The method according to the invention and the apparatus according to the invention are described in greater detail purely by way of example below on the basis of specific exemplary embodiments illustrated schematically in the drawings, further advantages of the invention also being discussed. In the figures, specifically:

FIG. 4b: shows an illustration of the signal variation as a function of distance for a segmented avalanche photodiode APD according to the invention, in comparison with the signal profile of an unsegmented APD in accordance with FIG. 4a;

DETAILED DESCRIPTION

Figure 1:
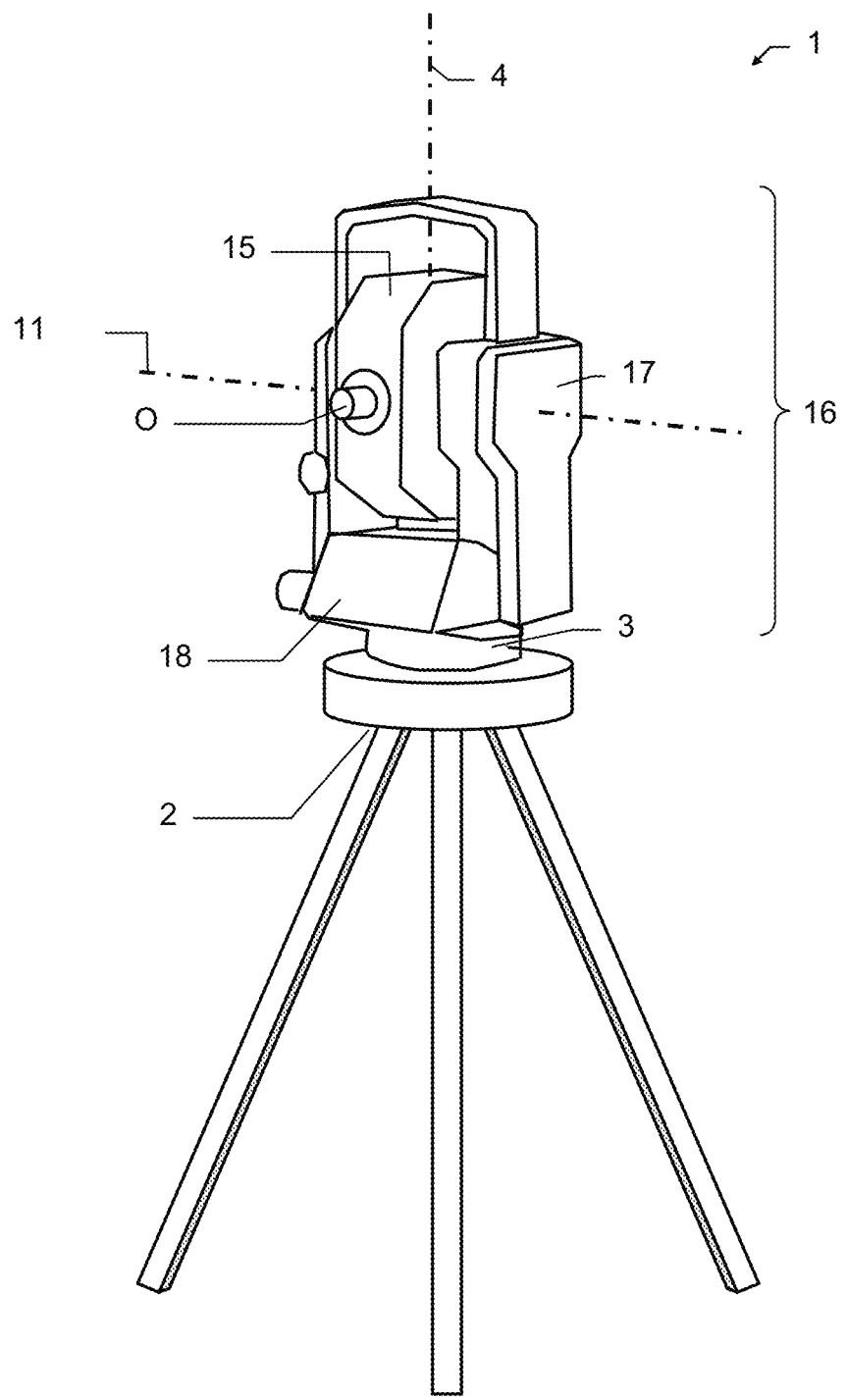
FIG. 1: shows a geodetic measuring instrument embodied as a total station according to the prior art.

FIG. 1 shows, as an example of the prior art, a geodetic measuring instrument 1 embodied as a total station 1 for measuring horizontal angles, vertical angles (corresponding to pivoting positions of a support 17 and a targeting unit or sighting device 15) and distances to a spaced-apart and sighted target.

The total station 1 can—as shown in FIG. 1—be arranged on a stand 2, wherein a base 3 of the total station 1 is directly and fixedly connected to the stand 2. The main body of the total station 1, said main body also being designated as upper part 16, is rotatable about a vertical axis 4 relative to the base 3.

In this case, the upper part 16 has a support 17—formed e.g. by two columns—, a sighting device 15 mounted rotatably about a horizontal rotation axis 11 between the columns, and also an electronic data processing and display module 18, which is formed by a control and evaluation component and a display. The electronic data processing and display module 18 can be designed in a known manner for the control of the measuring instrument 1 and for the processing, display and storage of measurement data.

The targeting unit or sighting device 15 is arranged rotatably about the horizontal rotation axis 11 on the support 17 and can thus be pivoted or tilted horizontally and vertically relative to the base 3 for the purpose of alignment with a target object. In this case, the sighting device 15 is embodied as a common sighting device structural unit, wherein at least an objective, a focusing optical unit, a coaxial camera sensor, an optical targeting reticle and the eyepiece O are arranged in or on a common sighting device housing.

By means of the sighting device 15, a target object can be targeted and the distance from the total station 1 to the target object can be detected by electrical sensor means. In addition, provision is made of means for the electrical-sensor-based detection of the angular alignment of the upper part 16 relative to the base 3 and of the sighting device 15 relative to the support 17. These measurement data detected in an electrical-sensor-based fashion are fed to the control and evaluation unit and processed by the latter, such that the position of the target point relative to the total station is ascertainable, graphically displayable and storable by the data processing and display module 18.

Nowadays, furthermore, scanning total stations are also known; in this case, the sighting device with distance measuring device is rotated by motor means about at least one of the two axes. In the case of these instruments used as a scanner, both the transmission beam and the reception beam are pivoted without a mirror movement in a grid-shaped fashion over a target object.

Figure 2:
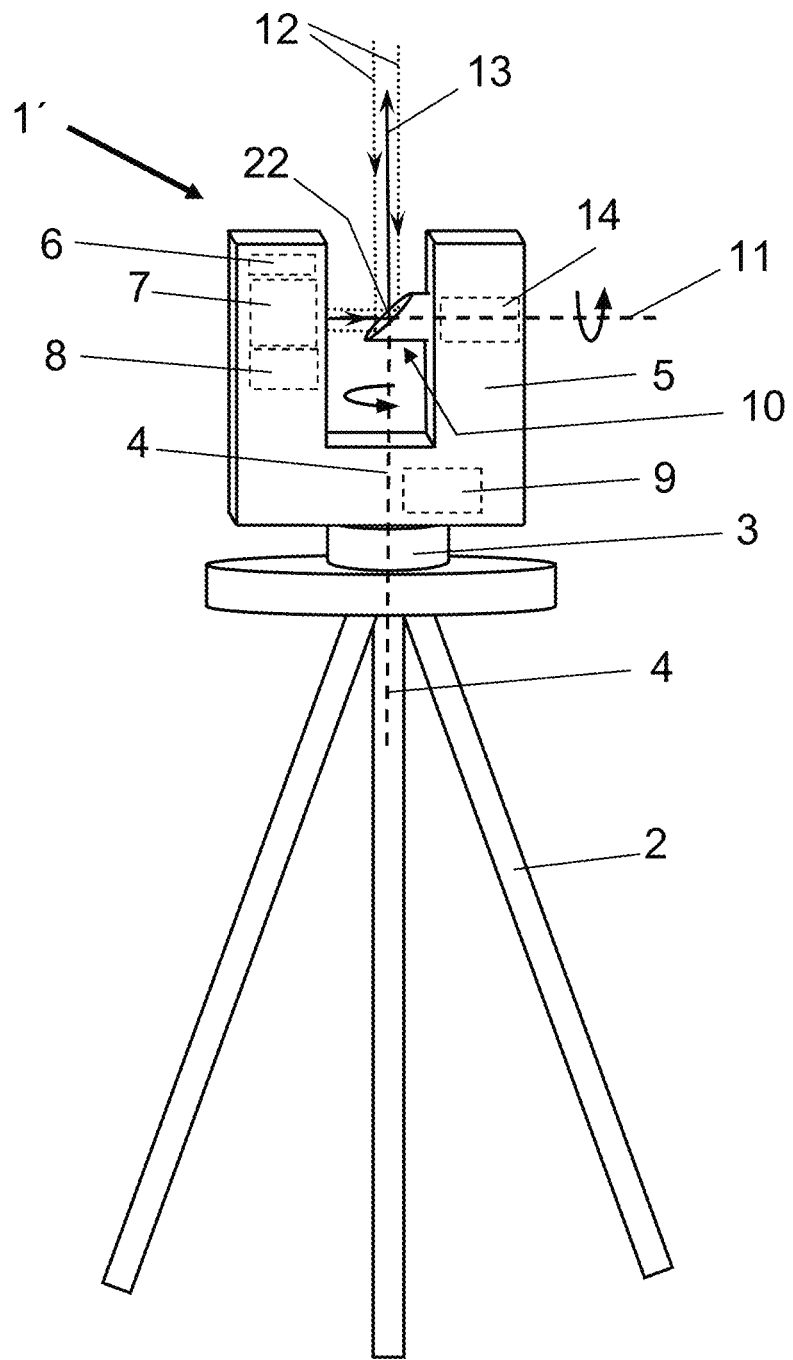
FIG. 2: shows a schematic illustration of a measuring instrument embodied as a laser scanner 1' for optically scanning the environment of the measuring instrument according to the prior art.

FIG. 2 shows, likewise in accordance with the prior art, a schematic illustration of a measuring instrument 1' embodied as a laser scanner 1' for optically scanning the environment of the measuring instrument 1'. The measuring instrument 1' has a measuring head having a housing 5, which is mounted on a base 3 rotatably about a vertical axis or base axis 4. The base 3, for its part, is mounted on a pedestal, embodied here as a stand 2.

This laser scanner 1' has a cylindrical rotation unit 10 comprising a rotary mirror 22, said unit being driven for rotation about its horizontal rotation axis or cylinder axis 11 by a motor arranged in a motor housing 14, as indicated by dashed lines in FIG. 2. As likewise indicated schematically by dashed lines in FIG. 2, a light source 6 for generating a transmission light beam 13 is arranged in a part of the housing 5 situated opposite the rotation unit 10, which light source is embodied in particular as a laser light source 6 and can emit a modulated, in particular pulsed and/or pulse-sequence-coded, laser beam. Furthermore, a photosensitive detector 8 having e.g. picosecond temporal resolution for receiving and detecting reception light beams 12 reflected from the environment to be optically scanned, and also optical components 7 for deflecting and reshaping the transmission light beams 13 and reception light beams 12 are provided in this housing part. The reception signal is then evaluated for example by a distance and/or amplitude measuring unit. Moreover, provision is made of a control unit 9 for the laser scanner 1' in the housing 5, likewise indicated by dashed lines, which control unit coordinates the rotation of the rotation unit 10 about the cylinder axis 11 and the rotation of the housing 5 about the base axis 4 during a scanning process.

In the operating state of the laser scanner 1', a generally pulsed transmission light beam 13 generated by the light source 6 is collimated by the optical components 7 and directed onto the rotary mirror 22, deflected there and emitted into the environment. Reception light beams 12 reflected or otherwise scattered from an object in the environment are captured again and deflected by the rotary mirror 22 and focused by the optical components and then forwarded onto the photosensitive detector 8. The direction of the transmission light beam 13 into the environment and the angle of incidence for reception light beams 12 on the rotary mirror result from the angular positions of the rotation unit 10 with respect to the cylinder axis 11 and the base axis 4, which are dependent on the positions of their respective rotary drives. These positions can be detected in this case—as is known per se—by assigned angle encoders (not illustrated here for the sake of simplicity).

The angular positions of the direction of the transmission light beam 13 at the instant of emission are relevant to the coordinates for representing a point cloud. The angular positions of the reception light beams 12 assigned to the objects were known previously only after distance calculation had been carried out. With the segmented APD according to the invention, however, information about the coarse distances, including from multiple targets, can already be derived from the parallelization of the signals and the temporal signal distribution among the at least two channels.

By means of the (fast) rotation of the rotary mirror 22 about the cylinder axis 11, for example at a rotation speed of between 50 Hz and 250 Hz, the environment is optically scanned along a circle line in a vertical plan. By means of a rotation (slow in comparison therewith) about the base axis 4, the entire space is scanned progressively with the circle lines. The totality of the measurement points of such a measurement results in a full scan of the space surrounding the apparatus. Depending on the type of evaluation, e.g. a 3D point cloud or, given simultaneous detection of the received light intensities, e.g. a photograph-like representation of the scanned environment can result from the scan.

Figure 3A:
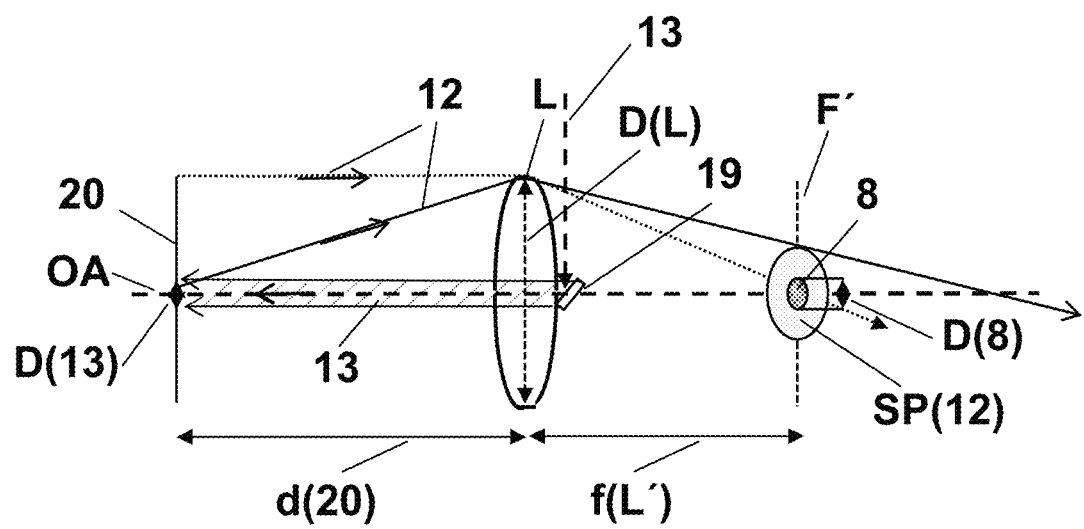
FIG. 3a: shows an illustration of the illumination of a detector embodied as an avalanche photodiode in the case of coaxial arrangement of transmitter and receiver, i.e. of transmission light beams and reception light beams.

FIG. 3a illustrates the illumination of an APD having a diameter D(8) as a detector 8 in the case of coaxial arrangement of transmitter and receiver, that is to say of transmission light beams 13 and reception light beams 12. The transmission light 13 from a light source, in particular laser light, is deflected via a (usually rotating) mirror 19 in the direction of a target object 20.

The diameter of the received light beam increases with decreasing distance d(20) between object 20 and converging optical unit L, which has a diameter D(L). In general, there exists a central shading or a circular central zone having a diameter D(13) around the optical axis OA where the reception light 13 is absent or is weaker than in the ring-shaped outer region of the radiation beam. This central shading likewise increases in diameter as the object distance d(20) becomes shorter.

A first (receiver-end) radiometric limit distance, also abbreviated hereinafter to "d1", is defined by that distance at which the diameter of the radiation beam is of the same size as the near field stop. The near field stop is usually defined either by the detector area, an aperture mask or the core of a reception optical waveguide. Starting from the distance d1, the associated signal of the APD detector 8, which is arranged at an image distance f(L') from the converging optical unit L and on which a received light spot SP(12) is incident in the image plane F', in which the detector 8 is positioned, no longer increases as the distance decreases further.

A second (receiver-end) radiometric limit distance, also abbreviated hereinafter to "d1$m$", is given where that distance at which the central shading of the transmitter completely covers the near field stop. Starting from this and shorter distances, a signal is receivable only to a very small extent or a signal is no longer receivable at all.

A resulting problem is firstly the quadratic signal decrease starting from the limit distance d1, such that the signals are very small in the case of large distances. Moreover, both strongly and weakly reflective objects are measured, which additionally increases the signal variation. The reception electronics therefore have to handle very large signal differences which can generally be varied by a factor of 5000 or more, which is virtually impossible to achieve with reception of electronics in the prior art. Primarily in the case of fast measurement sequences such as in the case of scanners with one million measurement points per second, various known solutions are inadequate or very complex and hence expensive.

Known solutions are:
  in the case of slow measurement sequences with measurement frequencies of less than 100 Hz, as customary in the case of theodolites, for example, a motor-driven neutral density wedge wheel, such that the optical reception signal is set optimally to the operating point of the reception electronics.
  In the case of measurement sequences with measurement frequencies in the kilohertz range, after a sample measurement from which the signal amplitude is developed, the APD gain is set accordingly in order that the reception signal lies in the modulation range of the reception circuit. Fiber-optic attenuators, constructed according to MEMS technology, as settable attenuators are also known.
  In the case of even faster measurement point sequences with measurement frequencies in the megahertz range, so-called "variable optical attenuators" (VOA) are appropriate. Said VOAs are based on electrooptical crystals and can be switched in the nanoseconds range. In the prior art, such components are very expensive and additionally require demanding drive electronics.
Settable transimpedance circuits are furthermore known. These transimpedance circuits are connected downstream of the APDs or the PIN diodes and enable an adaptation of the signal gain in the analog path. Alternatively, a settable voltage amplifier (variable gain amplifier, VGA) can also be positioned downstream of the transimpedance stage. Such electrically settable amplifiers have the disadvantage that their transient time is dependent on the set gain, and there is variation of the assigned characteristic curves at least against temperature. Such circuits are rather unsuitable for accurate measurements in the millimeter or submillimeter range.

There are distance measuring apparatuses which have logarithmetically operating amplifier elements in the reception signal path. However, these often have the disadvantage that the signal waveform is distorted and an accurate transient time determination becomes very complex as a result. Additionally switch-on drifts are particularly deceiving and barely detectable, and generate thermally governed phase shifts. No instruments having an absolute measurement accuracy of one millimeter or greater accuracy are known in the prior art.

Figure 3B:
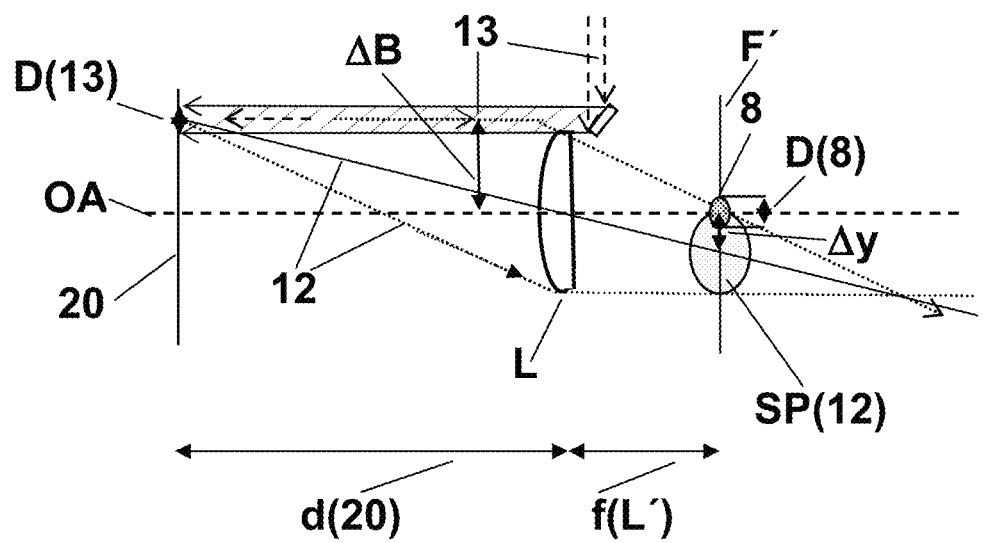
FIG. 3b: shows an illustration of the illumination of a detector embodied as an avalanche photodiode in the case of biaxial arrangement of transmitter and receiver, i.e. of transmission light beams and reception light beams.

FIG. 3b shows the illumination of an APD in the case of a biaxial arrangement of transmitter and receiver, that is to say of transmission light beams 13 and avalanche photodiodes 12, a biaxial offset ΔB being present here.

As in the case of FIG. 3a, here as well the diameter of the received beam increases as the distance d(20) decreases. At the same time, however, the center of the light spot/received light spot SP(12) shifts away from the optical axis OA toward the side, by an offset Δy.—The offset Δy results from the biaxial offset ΔB as follows:

$$\Delta y = (f(L') \times \Delta B / d(20)$$

This offset Δy resulting from the biaxial arrangement has the disadvantage that, in the case of the short distances, light is no longer incident on the reception diode 8.

Figure 4A:
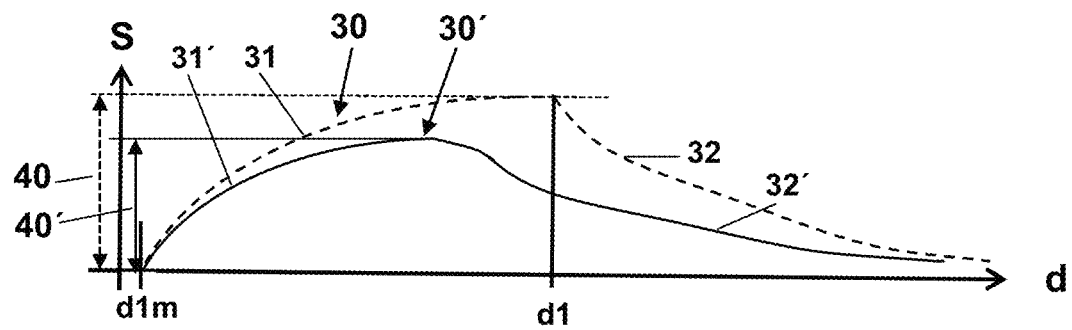
FIG. 4a: shows the signal variation as a function of distance with a simple, non-segmented avalanche photodiode APD according to the prior art for two different positions of the APD in the reception beam path.

FIG. 4a shows the signal variation as a function of distance with a simple, non-segmented APD according to the prior art for two different positions of the APD in the reception beam path, namely, corresponding to the dashed curve, in the focal plane with associated curve profile 30 and, corresponding to the side curve, between the converging optical unit (objective) and the focal plane of the objective with associated curve profile 30'.

In the case of the unsegmented APD according to the prior art, the signal dynamic range is characterized by two characteristic distances. Coming from long object distances (corresponding to the curve sections 32 and respectively 32') the signal increases quadratically as the distance decreases, to be precise as far as a radiometric limit distance d1. In the case of shorter distances than d1 the signal initially remains approximately constant; in the case of even shorter distances the signal decreases again owing to shading problems (corresponding to the curved sections 31 and respectively 31'). In the case of distances shorter than a second characteristic distance dim the signal is often too low to be able to yield reliable or low-noise measurements.

In this case, the required high signal dynamic range for the distance range to be covered also has a problematic effect, resulting in stringent requirements made of the quality of the APD and the signal processing electronics. The very large range 40 of the signal dynamic range for the curve profile 30, with positioning of the APD in the focal plane, is reduced only slightly to a signal range 40' by displacement of the APD into a position between focal plane and converging optical unit.

By means of a further independent APD segment such as is provided by the present invention (see below), light could additionally be received in conjunction with simultaneous reduction of the required signal dynamic range of an individual APD segment, and the distance measurement would be of improved quality.

Figure 4B:
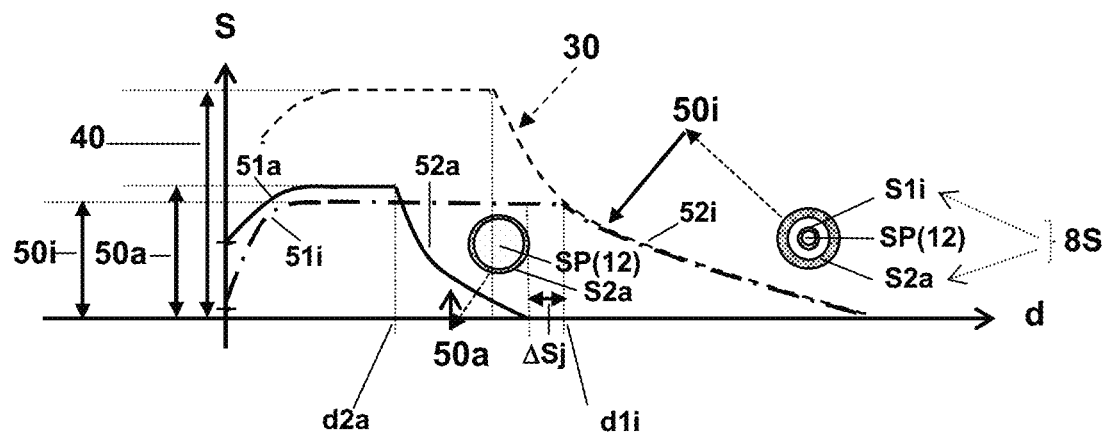

FIG. 4b illustrates the signal variation as a function of distance for a segmented APD 8S according to the invention, in comparison with the signal profile 30 of the unsegmented APD in accordance with FIG. 4a.

For a first embodiment of an APD 8S according to the invention comprising at least two independent segments S1i and S2a, the signals assigned to the individual segments S1i and S2a are depicted and compared with the signal of an integral APD in accordance with the illustration in FIG. 4a. This example involves a segmented APD 8S comprising two segments S1i and S2a arranged concentrically and spaced apart from one another, namely an inner, circular segment S1i for a determination of relatively large distances and an outer, ring-shaped segment S2a for a determination of relatively small distances.

The individual signal profile curves, namely 50i for the inner APD segment and 50a for the outer APD segment, are qualitatively similar to the curve profiles 30 and respectively 30' for the unsegmented APD. Coming from large distances, in accordance with the curve sections 52i and respectively 52a, the signal initially once again increases quadratically as the distance decreases, namely up to a first maximum value corresponding to a signal dynamic range 50i for the inner segment S1i in the case of a limit distance d1i and up to a second maximum value corresponding to a signal dynamic range 50a for the outer segment S2a in the case of a limit distance d2a, where d2a<d1i.

The distance range ΔSj is distinguished by the constancy of the signal of the inner APD segment (since in the case of decreasing distances starting from the distance d1i this inner segment is completely covered by the retaining light beam and the energy per area of the retaining light beam indeed does not increase further even in the case of distances becoming shorter, rather the diameter increases). The inner segment is therefore not supersaturated in the distance range ΔSj or with distances becoming even shorter, since the reception signal does not increase further. The outer segment does not yet receive a signal here in the range ΔSj (that is to say is not yet covered here by the retaining light beam, but rather only again at even shorter distances). Said range ΔSj is crucially determined by the distance between the two segments S1i and S2a. The size of the distance interval ΔSj can be dimensioned by means of a suitable distance between the two APD segments. In this case, care should be taken to ensure that in the case of even shorter distances the signal of the outer APD segment has attained a high signal-to-noise ratio before the signal of the inner APD segment has become unusably small owing to a shading in the case of short distances.

The figure illustrates that even in the case of a two-segment APD 8S having different signal gain of the assigned channels, the reduction of the signal dynamic range as a function of distance is considerable, namely by signal dynamic range 40 for the unsegmented APD to 50a and respectively 50i for the two segments of the segmented APD 8S according to the invention.

Moreover, it is also evident that the signal dip (of the outer APD segment S2a) turns out to be smaller in the case of short distances. This is achieved for example if the two-segment APD has an inner element of 100 µm diameter and an outer element of 300 µm diameter in comparison with a one-segment APD having a size of 200 µm. With three segments, the signal smoothing over the distance would be dimensionable even more finely.

Therefore, the invention not only solves the problem of the signal dynamic range, but can also be used as a measure for signal increase in the near range in the case of very short distances. In particular, therefore, at least one reception segment can be dimensioned and arranged such that a light signal backscattered from a target object situated in the near range, in particular <5 m, and having—as viewed in a reception plane—a beam cross section having a comparatively large diameter and comparatively large central shading is receivable, in particular wherein the reception segment is embodied in an annular fashion or in an annulus-segment-shaped fashion and has an outer circle diameter of at least 200 µm or 300 µm, specifically of at least 500 µm. By means of suitable configuration of the sensor areas (that is to say such that at least one segment is also positioned in the reception plane exactly where the light signals are backscattered from objects situated at very short distances), potential problems can be solved both by the central shading in the case of coaxial systems and by the transition of the light spot SP(12) in the case of biaxial optical units.

Ambient light or background light is principally disturbing in the case of weak signals, in particular in the case of large distances. The photocurrent generated by ambient light generates shot noise, which impairs the measurement result. Firstly, the subdivision of the APD into a plurality of independent segments means that the contribution of the background light is also divided. The disturbing influence of the shot noise decreases with the square root of the distance. Secondly, the APD segment assigned to the longest distance, S1i, can be designed to be correspondingly smaller. The influence of the shot noise in the case of large distances is thus additionally reduced.

Figure 5:
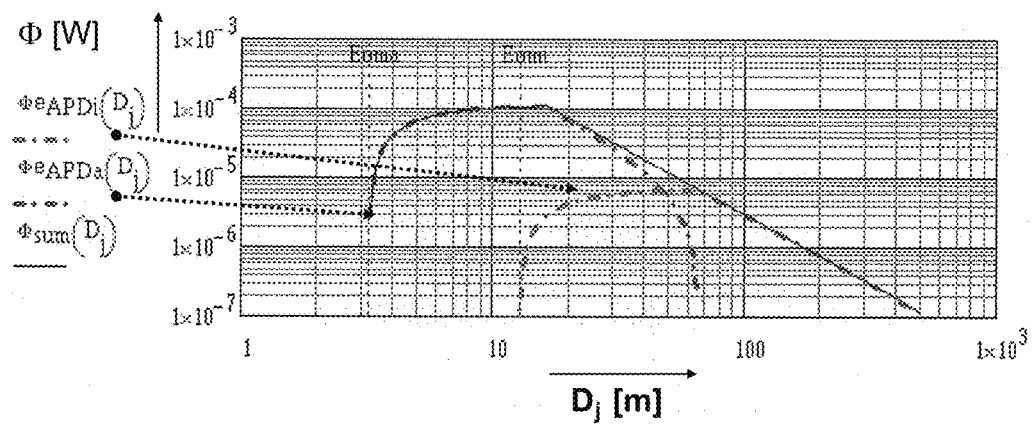
FIG. 5: shows an exemplary signal profile of the received optical powers of a two-segment APD according to the invention as a function of the distance to a target object.

FIG. 5 shows an exemplary signal profile of a two-segment APD according to the invention as a function of the distance $D_j$ to a target object. In this case, the illustration shows the optical reception powers $\Phi eAPDi(D_j)$ for an inert segment and $\Phi eAPDa(D_j)$ for an outer segment and also the sum $\Phi sum(D_j)$ of the reception powers of the two APD segments.

In the distance measurement range illustrated, the outer APD segment registers an, albeit initially still low, reception signal starting from a limit distance of approximately 3 m, wherein the signal then increases greatly with increasing distance up to a distance of approximately 8 m, up to an upper limit value of approximately $1 \times 10^{-4}$ W, and remains at this upper limit value up to a distance of approximately 25 m before subsequently then falling again to a greater and greater extent as the distance increases further, that is to say if the received light spot is evidently too small to still reach the outer APD segment. By contrast, the signal of the inner APD segment greatly increases from more or less zero with increasing distance only starting from a limit distance of approximately 12 m and at approximately 40 m reaches a limit value (approximately $6 \times 10^{-5}$ W), from which it then decreases significantly more slowly as the distance increases further.

According to the invention, the novel APD is divided into a plurality of independent segments, as illustrated by way of example below by FIG. 6a for a coaxial arrangement of transmitter and receiver, and by FIG. 6b for a biaxial arrangement of transmitter and receiver.

In this case, the detector according to the invention is divided, or the APD 8S according to the invention is segmented, in such a way that in the case of large distances up to a first limit distance to be defined the entire light spot SP(12) is incident on an innermost segment S1i. In the case of smaller distances than said first limit distance the light spot SP(12) is larger than the first reception area S1i, and a part of the light spot SP(12) that increases as the distance becomes ever shorter is no longer received with this first segment S1i. This means that the reception signal in the case of larger distances than said first limit distance the signal of the innermost segment S1i no longer increases. The signal dynamic range is thus limited.

Each independent APD sensor element is allocated a dedicated reception circuit, as illustrated later in FIG. 10. The reception signal and thus the signal dynamic range are divided as a result. In order that the signal dynamic range is reduced not just additively, but multiplicatively, the individual signal paths are formed with different signal gain. By way of example, the gain of a second segment for medium to short distances is provided with a ten times smaller gain.

In order that the reception currents are not allowed to rise disproportionately even in the near range, the outer APD segment can also be embodied in a bipartite fashion consisting of two semicircular ring segments, such that the area of the two outer segments corresponds to that of the inner segment.

Figure 6A:
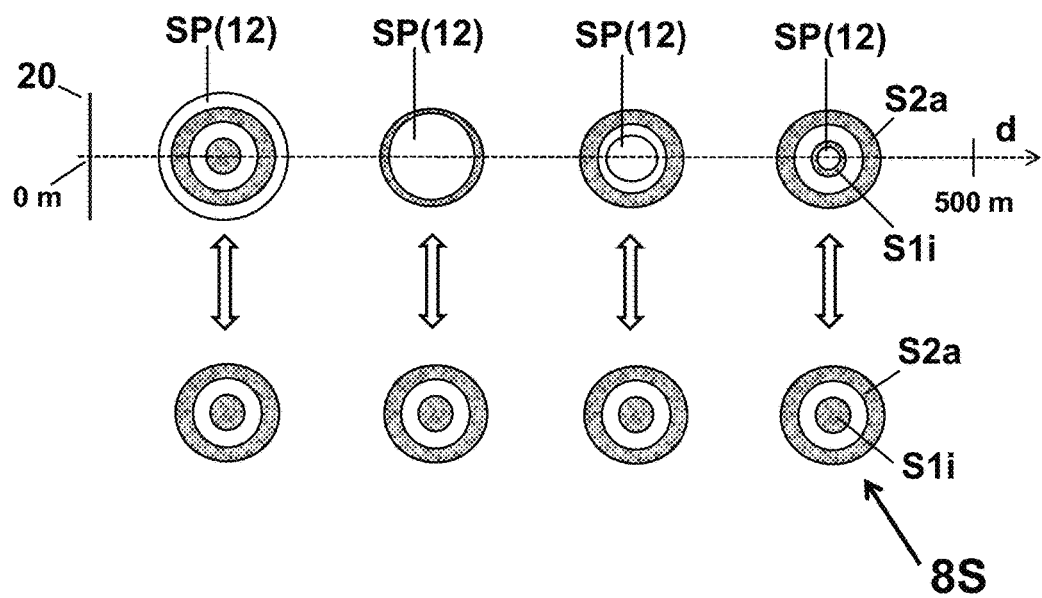
FIG. 6a: shows an illustration of a first embodiment of a segmented avalanche photodiode APD according to the invention, as an example of a detector according to the invention, and its use in a coaxial arrangement of transmitter and receiver for different distances from the target object to the APD.

FIG. 6a illustrates a first embodiment of a segmented avalanche photodiode APD 8S, as an example of a detector according to the invention, and its use in a coaxial arrangement of transmitter and receiver in the case of different distances from the target object to the APD 8S.

The segmented APD 8S illustrated by way of example in FIG. 6a consists of two segments S1i and S2a, wherein each segment is assigned a distance range to the object 20, here indicated schematically by boundary distances of 0 m and 500 m. Each APD segment S1i, S2a contributes a respective part of the entire required signal dynamic range which would otherwise result from the entire distance range to be covered. The areas of the APD segments S1i and S2a are embodied as follows in accordance with this exemplary embodiment:

- an innermost APD segment S1i is a circle area and collects optical radiation at very long and medium distances. In the case of distances shorter than a first (far) limit distance, in the case of which the light spot has reached the size of the sensor area of the innermost APD segment, the signal no longer increases (even if the beam cross section then naturally still increases further in the case of nearer distances). Starting from a further limit distance, the received light beam is attenuated by a central shading in the region of the optical axis, such that the reception signal then thus decreases again in the case of distances becoming shorter, since again less light is incident on the innermost APD segment as a result of the central shading.

- The second APD segment S2a is a ring area and detects optical radiation starting from medium to short distances. The light beam therefore impinges on this ring area only in the case of this distance range. Since the signal strength is rather high in the near range owing to the square law relating to distance, the electronic gain assigned to this APD segment can be lower than that of the central APD segment. The signal dynamic range at the output can thus be advantageously reduced.

- In the case of quite short distances, the central shading is larger than the APD ring area. In order nevertheless still to receive light in the case of quite short distances, a third ring-shaped APD segment can be added. Moreover, the second ring element can have a larger external diameter than that of a standard APD, but in order that the area of this APD segment does not become disturbingly large, it can also have a polar sedimentation consisting of angular sectors instead of the ring-shaped form.

Figure 6B:
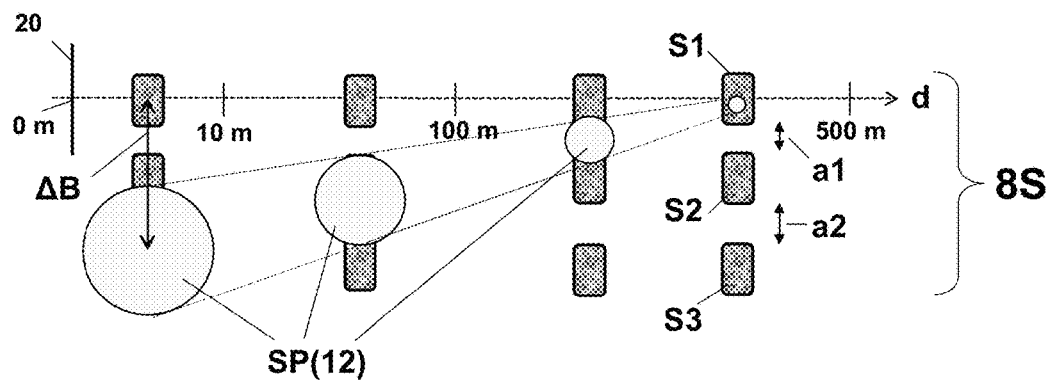
FIG. 6b: shows an illustration of a second embodiment of a segmented avalanche photodiode APD according to the invention, as an example of a detector according to the invention, and its use in a biaxial arrangement of transmitter and receiver for different distances from the target object to the APD.

FIG. 6b illustrates a second embodiment of a segmented avalanche photodiode APD 8S, as an example of a detector according to the invention, and its use in a biaxial arrangement of transmitter and receiver at different distances d from the target object to the APD 8S.

An asymmetrical arrangement of the independent APD segments, here S1, S2 and S3, is advantageous in the case of biaxially arranged optical systems. APD segments of identical area are depicted in this illustration and the maximum photocurrents are thus of similar amplitude; in this case there is not necessarily a need for different amplification stages of the electronic amplifiers assigned to the segments. APD segments having an identical area additionally have the advantage that the segments have identical charge capacities. As a result, the rise times of the electric currents are of identical magnitude, which simplifies the signal processing.

Since the APD segments are assigned to dedicated, i.e. predefined or predefinable, distance ranges, an APD receiver 8S or detector according to the invention comprising independent segments and signal paths is also advantageous for an unambiguity solution during a distance determination.

The "unambiguity solution" is understood here to mean the following: it is necessary to determine the number of pulses that are in the air simultaneously. Otherwise, the distance cannot be calculated unambiguously. If the laser shot rate is greater than the inverse of the light propagation time over the distance to be measured, then more than one light pulse is situated between transmitter and receiver. Previous methods are based on signal modulations that have been known for decades. Phase or interval modulation (PSK), frequency modulation (FSK), amplitude modulation (ASK), polarization modulation or wavelength codings are often used.

However, a coarse distance estimation can advantageously be performed with the signals of the individual APD segments. If a pulse or received light spot SP(12) appears only on the innermost segment S1, then the object distance d must be greater than or equal to the distance assigned to the segment S1. By contrast, if a pulse SP(12) simultaneously appears on the innermost segment S1 and the adjacent segment S2, then the object distance must be in an interval between 0 m and a possible intermediate distance range with respect to the distance assigned to the segment S1.

In the case of a plurality of segments, the subdivision of the distance intervals can be continued and/or refined. In this case—depending on the distance range to be covered—distances a1, a2, ... between successive segments S1, S2, S3, etc. can be uniform or else different.

In the case of the example illustrated in FIG. 6b, this example not being to scale, a received light spot SP(12) in the case of an object distance of approximately 5 m covers the outer segment S3 completely and the middle segment S2 partly, for instance by half. In the case of an object distance of approximately 30 m, a corresponding received light spot SP(12) covers the middle segment S2 completely and the outer segment S3 only to the extent of a small part. In the case of an object distance of approximately 150 m, a corresponding received light spot SP(12) covers the mutually opposite edge regions of the segments S1 and S2, and, in the case of an object distance of approximately 400 m, a corresponding received light spot SP(12) fills only a small part of the innermost segment S3.—It goes without saying that this figure should be understood merely as purely illustrative for purposes of example.

Figure 7A:
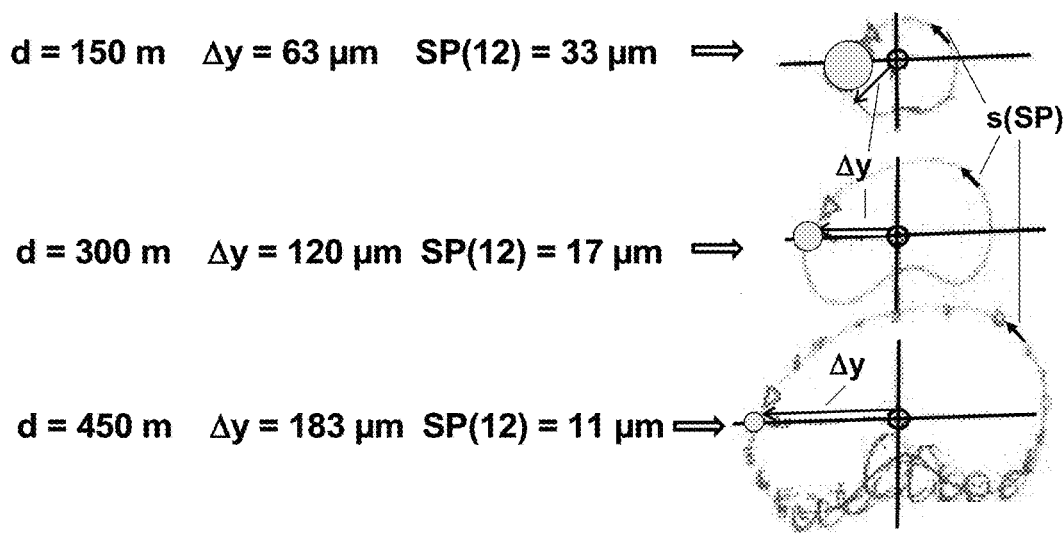
FIG. 7a: shows an illustration of the light distribution in the reception light plane during a scanning movement, for example using a rotating mirror, for a coaxial arrangement of transmitter and receiver.

FIG. 7a shows an illustration of the light distribution in the reception light plane during scanning, i.e. using a rotating mirror, for a coaxial arrangement of transmitter and receiver.

In the case of a moving measurement beam, such as, for example, in the case of a terrestrial scanner or atmospheric LIDAR, the light spot in the focal plane of a reception optical unit can shift laterally with respect to the optical axis. This complicates the arrangement of the independent APD segments.

A table in FIG. 7a shows in one example what order of magnitude these deviations from the optical axis have and how a movement s(SP) of the light spot in the detection plane of a coaxial transmitter/receiver system is manifested in the case of different object distances d.

The lateral or radial deflection Δy of the centroid of the received light beam in the focal plane of a reception objective is calculated as follows:

$$\Delta y := fe \cdot \frac{4\pi}{co} \cdot f_{rot} \cdot Dist$$

In this case, "fe" denotes the effective receiver focal length, "co" denotes the speed of light, "$f_{rot}$" denotes the rotational speed of the rapidly rotating mirror, and "Dist" denotes the distance to the target object.

The diameter $Dia_{spot}$ of the light spot on the focal plane of the receiver is:

$$Dia_{spot} := \frac{fe \cdot de}{Dist}$$

In this case, "de" stands for the pupil diameter of the optical reception system.

In the near range, the light spot diameter is considerably larger than the radial movement deflection synchronous with the rotary mirror. However, starting from a sufficiently large object distance, the light spot moving synchronously with the rotary mirror describes an unambiguously visible path. The latter constitutes a closed path corresponding to the respective scan profile.

By way of example, the path of the light spot is already visible if the dynamic radial displacement Δy of the light spot corresponds to at least half of the diameter SP(12) thereof.

This minimum distance "$Dist_{dyn}$" to the target object at a constant mirror rotation frequency "$f_{rot}$" is thus calculated as:

$$Dist_{dyn} := \sqrt{\frac{co \cdot de}{8\pi \cdot f_{rot}}}$$

Starting from distance "$Dist_{dyn}$", a path of the light spot is observable in the detection plane. The following numerical example is typical of terrestrial scanners:

$de$=50 mm, $f_{rot}$=50 Hz, $co$=3×10$^{-8}$ m/s $Dist_{dyn}$ is thus 109 m.

This characteristic distance $Dist_{dyn}$ with an unambiguously discernible radial displacement is short enough to solve, at measurement rates of one million measurement points per second, the ambiguity question by means of the signal frequencies or the signal clock rate of the individual reception signals assigned to the segments, without a complex algorithm; this is because scanners often have a laser shot rate or point measurement rate of one million points per second, which results in a first unambiguity range of 150 m and is thus longer than $Dist_{dyn}$, which means that starting from 150 m the radial deflection rather than the diameter of the light spot is now dominant, which considerably simplifies the evaluation of the signals assigned to the APD segments (starting from a distance of 150 m two pulses are simultaneously underway at this measurement frequency, three pulses starting from a distance of 300 m, etc.). The coarse distance estimation of the reflected pulses can occur as follows in the case of rapidly scanning laser beams:

if signal on outer APD segment then large distance and thus second unambiguity range 150 m . . . 300 m if signal on inner APD segment then short distance and thus first unambiguity range 0 m . . . 150 m.

Figure 7B:
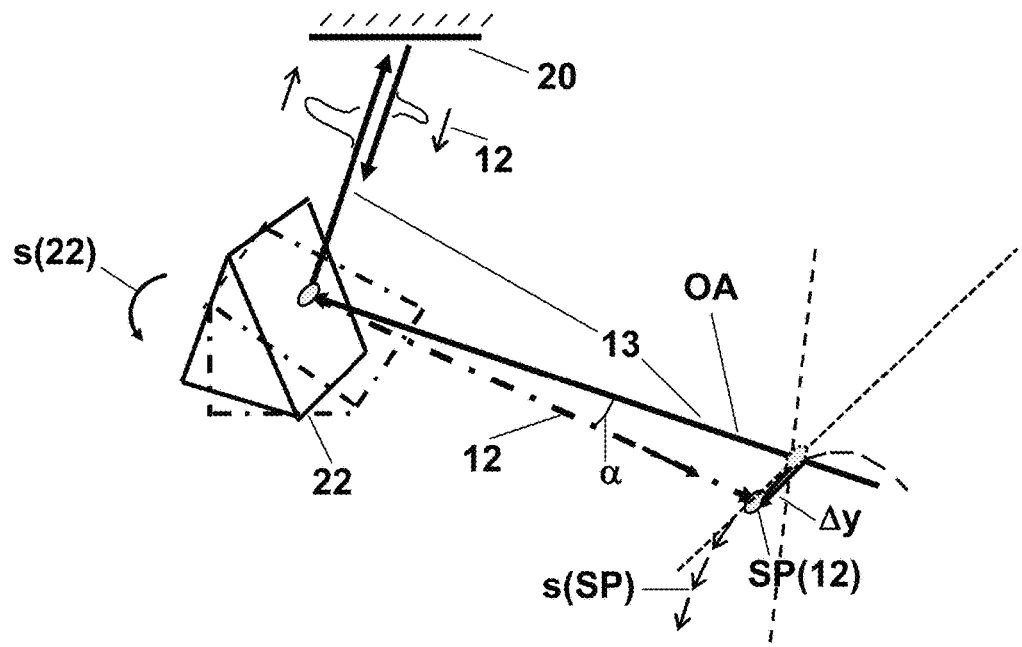
FIG. 7b: shows an illustration of how the reflected reception light beam is directed away from the optical axis in the case of a rotating scanner mirror and a radial displacement of the position of the received light spot on the detector is produced as a result.

FIG. 7b shows an illustration of how the reflected reception light beam 12 in the case of a rotating scanner mirror 22 is directed away from the optical axis OA and a radial displacement Δy of the position of the received light spot SP(12) is produced on the detector as a result.

The position of the rotating mirror 22 is indicated by solid and dashed lines for two different points in time during the mirror rotation s(22). In this case, the solid lines relate to the point in time at which the transmission light beam 13 impinges on the rotary mirror 22 and is deflected by the latter to the target object 22. Until the reception light 12 returning from the target object 20 impinges back on the rotary mirror 22, however, the latter has rotated further by an angle dependent on the rotational speed, and so the reception beam 12 deflected by the rotary mirror 22 no longer impinges on the detector at the impingement point corresponding to light signals from the optical axis, but rather in a manner radially displaced by Δy.

Figure 7C:
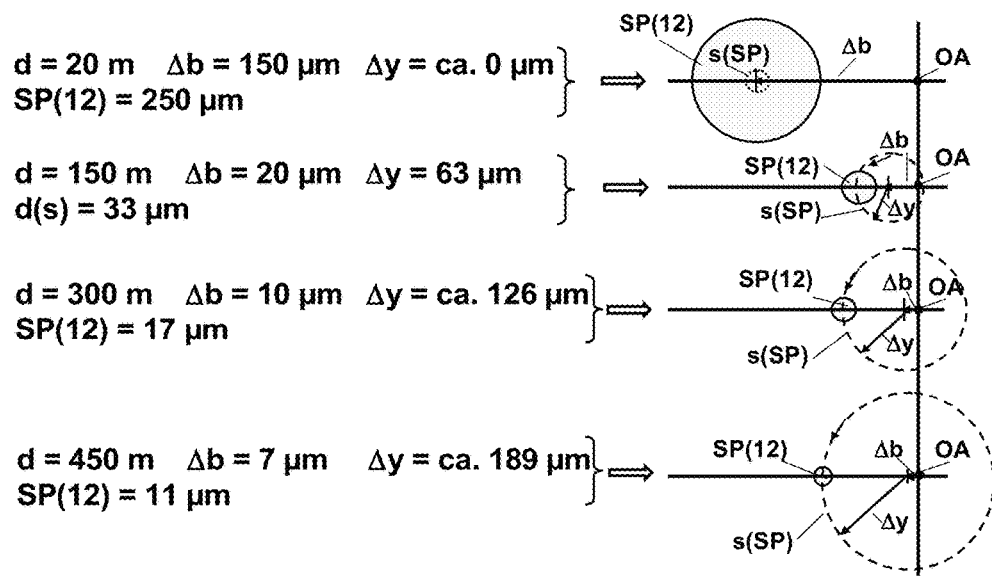
FIG. 7c: shows, in an illustration analogous to FIG. 7a, an illustration of the light distribution in the reception light plane during scanning, i.e. using a rotating mirror, for a biaxial arrangement of transmitter and receiver.

FIG. 7c shows by way of example, in an illustration analogous to FIG. 7a, an illustration of the light distribution, in particular of the light spot sizes SP(12) and radial displacement Δy, in the reception light plane during scanning, i.e. using a rotating mirror 22, for a biaxial arrangement of transmitter and receiver, in the case of different distances to the target object 20.

In the case of biaxial optical systems, too, starting from a sufficiently large object distance d, a movement of the light spot SP(12) is unambiguously discernible. The movement in turn constitutes a closed path s(SP) which corresponds to the vectorial sum of the parallax-governed offset and the deviation, i.e. the further movement of the rotary mirror 22 by an angle α, during the rotation thereof.

Since the movement and the size of the light spot are unambiguously describable, the optimum design of the arrangement and shape of the APD segments can be optimized depending on the objective. If a small signal dynamic range is of the highest priority, then an APD having as many small-area segments as possible is advantageous. This is also advantageous for reducing the influence of sunlight specifically or of ambient light generally. By contrast, if the unambiguity (ambiguity) is to be ascertained, then the different segments of the APD according to the invention should be adapted to the—in the case of the scanners—only a few, discrete stages settable mirror speeds (for example 25 Hz, 50 Hz, 100 Hz).

Figure 8:
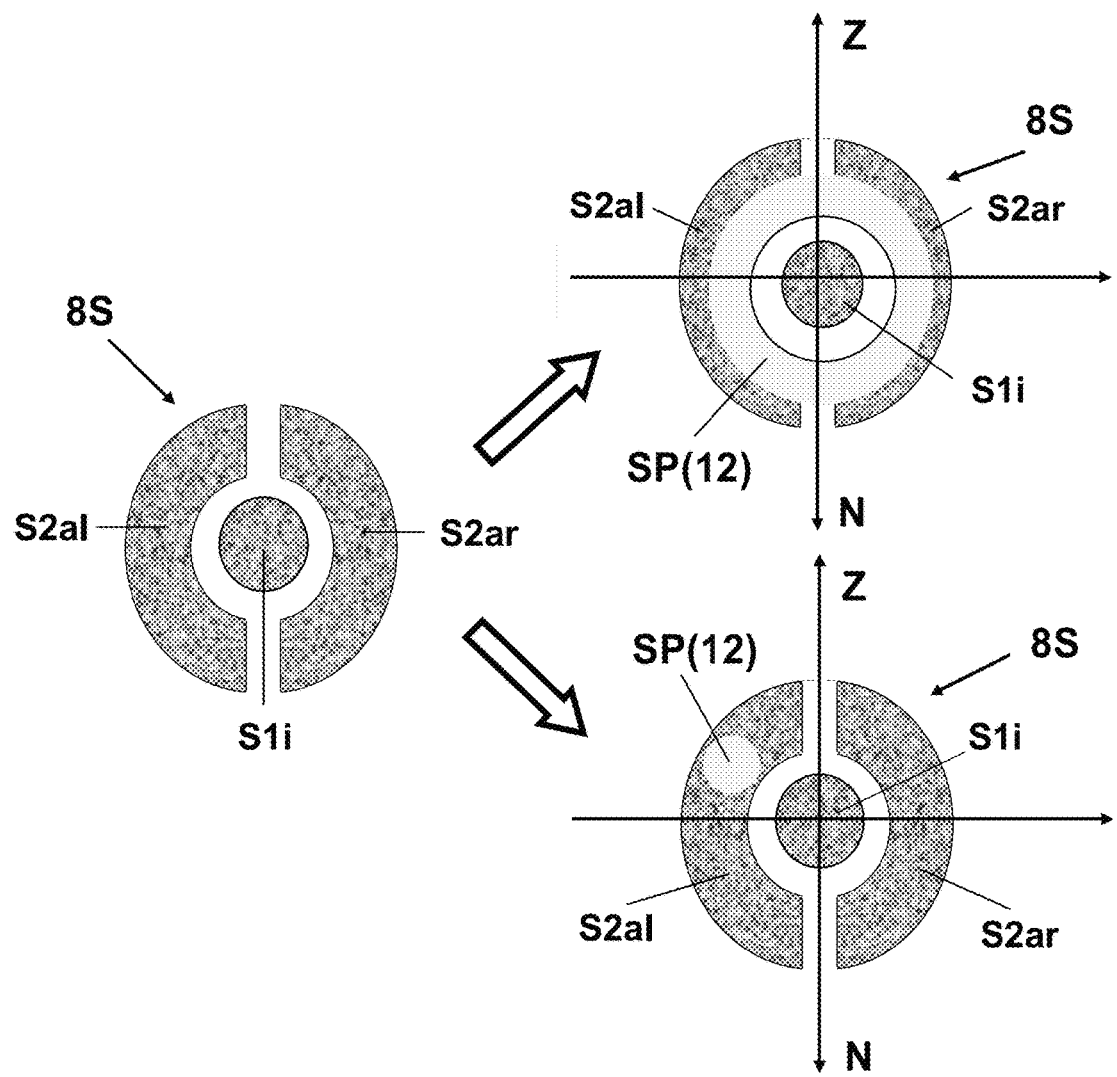
FIG. 8: shows a further embodiment of a segmented APD according to the invention for a use in association with a rapidly rotating scanner mirror.

FIG. 8 shows a further embodiment of a segmented APD 8S according to the invention for use in association with a rapidly rotating scanner mirror. The left part of the figure illustrates this segmented APD 8S consisting of three individual segments S1$i$, S2$a$1 and S2$ar$, comprising an inner segment S1$i$, an (in this illustration) left-hand outer segment S2$a$1 and a further (in this illustration) right-hand outer segment S2$ar$.

The two partial figures on the right illustrate the use of this segmented APD 8S in two different application situations. In the diagrams, Z denotes the zenith direction and N denotes the Nadir direction.

The upper partial figure illustrates a case at a short distance to a target object, wherein a relatively large received light spot SP(12) is reflected back onto the APD 8S. In the case of the underlying arrangement here, a central shading of the reception light is produced. Therefore, no light is incident on the inner segment S1$i$, or the received light spot SP(12) covers parts of both outer segments S2$a$1 and S2$ar$. The lower partial figure illustrates a situation of a relatively large distance to the target object, in the case of which a relatively small received light spot SP(12) is generated, which is incident only on the left outer segment S2$al$. Such a situation should be regarded in particular as representative of and advantageous for an axial arrangement of transmitter and receiver. The measurement situation illustrated facilitates a differentiation between short and large distances to the target object, which is thus at least advantageous for a solution to the known ambiguity problem if two light pulses are underway between target object and receiver simultaneously, i.e. within one measurement cycle.

A coarse distance estimation and thus a solution to the unambiguity are provided by the above-explained signal distribution of the APD segments.

By way of example, a very short distance is present if the signal strengths of the segments are like:
S2$al$≅S2$ar$ and S1$i$≅0.

A medium distance is present if the signal strengths of the segments are like:
S2$al$=S2$ar$ and S1$i$>>0.

A long distance is present if the signal strengths of the segments are like:
S2$al$>>0, S2$ar$≅0 and S1$i$≅0 at scanning angles of 0 to 180° and
S2$al$≅0, S2$ar$>>0 and S1$i$≅0 at scanning angles of 180 to 360°.

Figure 9:
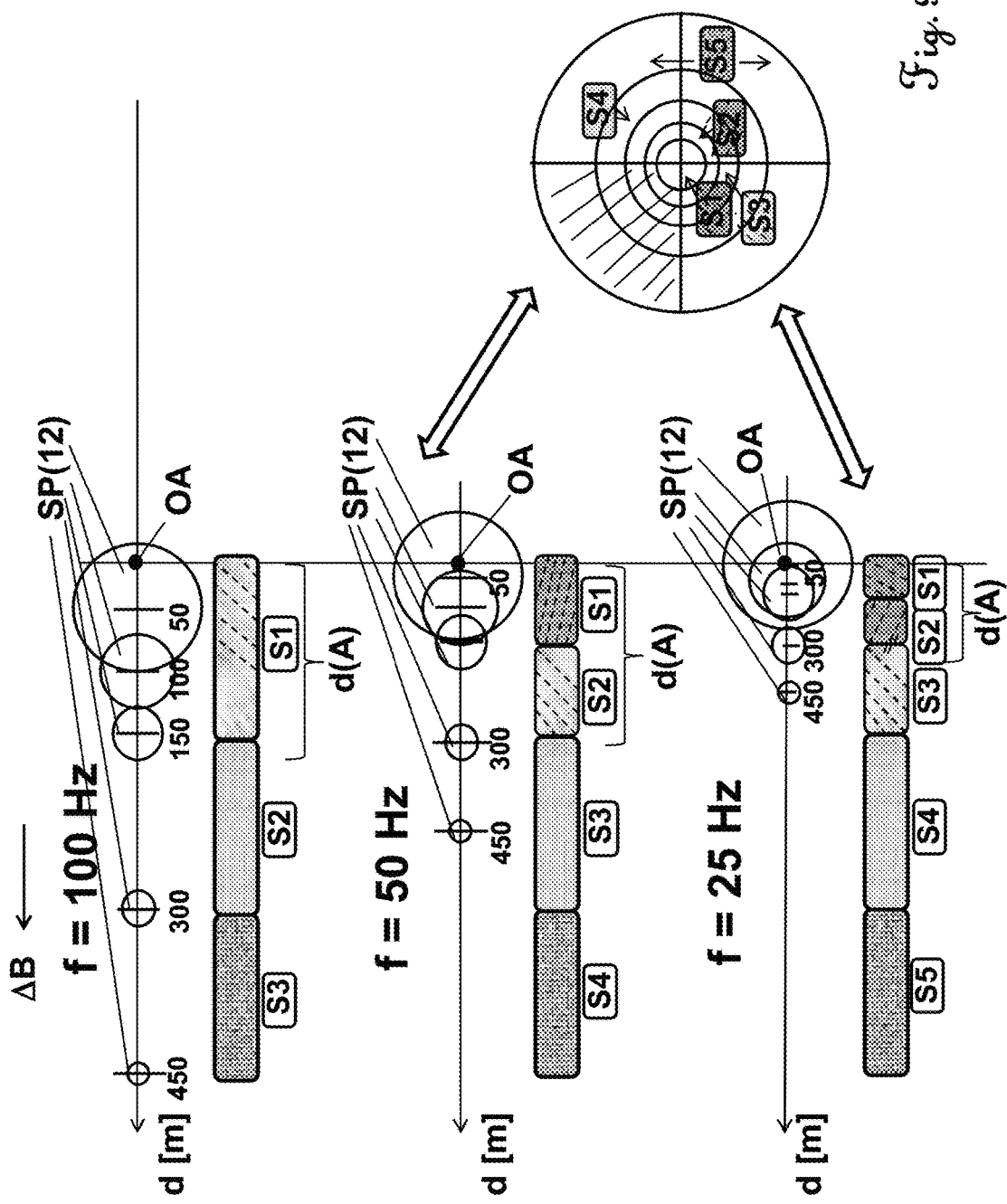
FIG. 9: shows an illustration of a problem solution according to the invention, in particular for scanning with a rotating scanner mirror.

FIG. 9 shows an illustration of a problem solution according to the invention, in particular for scanning with a rotating scanner mirror.

In the case of scanning with a rapidly rotating scanner mirror, the unambiguity solution, with regard to the demand in respect of fulfilling it, is more demanding than with the use of quasi-static measurement beams or transmission light beams. FIG. 9 illustrates one approach according to the invention as to how an appropriate APD segmentation can be derived, particularly if the unambiguity problem is intended to be solved.

Both in the case of coaxial and in the case of biaxial optical systems, a movement of the light spot or received light spot SP(12) is unambiguously discernible starting from a sufficiently large distance to the target object. The unambiguity determination is intended to be ascertained by means of a suitable segmentation of the APD sensor areas.

At every scanning angle (=polar angle) it is possible to measure the size and the positioning of the light spot with this APD segmentation. In accordance with this exemplary embodiment, the segments S1, S2, S3, S4 and S5 are arranged such that it is possible to ascertain the unambiguity of a reception signal for a distance measurement with a measurement frequency at three different rotational speeds of the scanner mirror (corresponding to 25 Hz, 50 Hz and 100 Hz) relative to the fast scanning axis. The five segments are advantageously embodied as annulus areas. If the areas of the outer segments are too large with respect to an influence of ambient light, these circle segments can be subdivided further, for example into quadrants, according to the invention.

The signal dynamic range is primarily a problem for the range of short distances. In this example, the inner segments of the APD according to the invention are assigned to these distances. This also applies to very fast scanning mirror movements, since the latter do not produce a significant resultant offset of the impingement point of the reception signal on the detector owing to the relatively short light propagation time between target object and detector. A fine subdivision, corresponding to the illustration in FIG. 9, in the center of the APD circle structure is therefore sufficient for dividing the signal in the near range among more than one APD segment. The light spot is larger than the innermost APD segment already in the case of medium distances. As a result, the radiometric limit distance is shifted toward larger distances and the signal dynamic range is reduced as a result.

Figure 10:
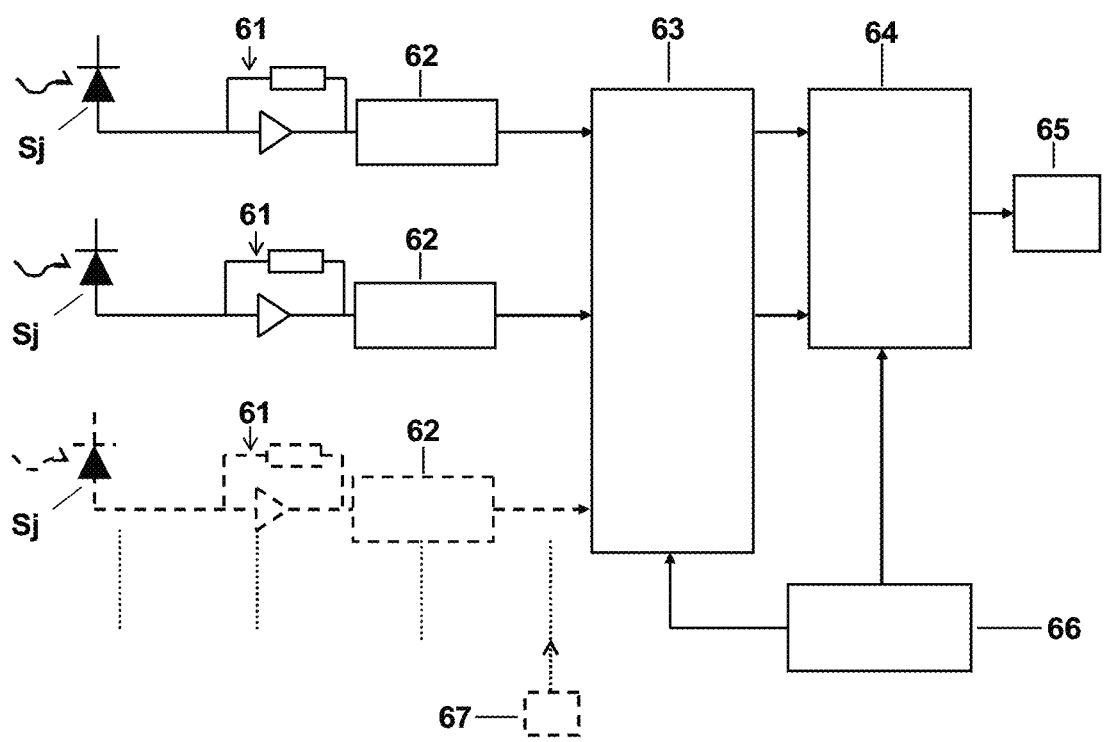
FIG. 10: shows a block diagram for the signal processing in the signal path of a detector according to the invention or of an APD according to the invention.

FIG. 10 shows a block diagram for the signal processing in the signal path of a segmented detector according to the invention or of a segmented APD according to the invention, wherein the signal paths for the processing of the signals from two APD segments S$_j$ are indicated by means of solid lines and the signal path from a third APD segment S$_j$ is indicated by means of broken lines. In this case, an additional multiplexer 67 driven by a "field programmable gate array" FPGA 64 is likewise indicated. A "master clock" 66 clocks the analog-to-digital converter 63, which is embodied for example as a "multi core ADC" or "ADC bank", and the FPGA 64. The measurement data are finally transferred from the FPGA 64 to a data backup 65.

If the unambiguity problem in the case of a distance determination is solved by means of transmitter-end modulation methods as in the prior art, the individual reception channels assigned to the APD segments S$_j$ can be combined by means of a multiplexer circuit. As a switching criterion regarding which reception signal, in each case after amplification by a transimpedance amplifier 61 and passage through a filter 62, is conducted as far as an analog-to-digital converter (ADC) 63, the signal strength can be used, for example. However, the signal path can also be created or connected as soon as a signal exceeds a predefined threshold and this signal is simultaneously assigned to the shortest distance range. Alternatively, the signal path can be connected as soon as a signal exceeds a predefined threshold and this signal is simultaneously assigned to the longest distance range. A further possibility for signal routing is a permanent interconnection of the individual reception channels assigned to the APD segments S$_j$, wherein each of the channels has a different time delay upstream of the summation point. As a result, a single reception pulse is divided into a plurality thereof and fed temporally successively to an analog-to-digital converter (ADC) 63.

In the first case, the targets are detected and evaluated which form the best signal-to-noise ratio (SNR) and therefore yield the most accurate distance results or measurement points. In the second case, the first target is measured ("first target detection"), and in the third case such targets which are the furthest away from the detector or reception segment S$_j$ but are still readily measurable are measured ("last target detection").

In a "field programmable gate array" FPGA 64, the arriving signals are processed in real time, for example at a frequency of 2 mHz. In this case, pulses are sought and the amplitudes and the points in time of the signals from the APD segments $S_j$ are determined at sub-sampling accuracy. Moreover, diverse statistical quantities such as, for example, signal noise and signal-to-noise ratios SNR are calculated. According to the invention, the unambiguity can also be determined on the basis of the signal patterns on the different channels. By way of example, the spot size is correlated with the distance to a target object. The lateral offset of the received light spot on the detector, if the scanning mirror is pivoted at corresponding speed, also constitutes a measure of the distance. Spot size and/or lateral offset of the light spot can be ascertained with the aid of a suitable arrangement and shape of the APD segments.

The plurality of reception signals can also be used for increasing the robustness of the data evaluation, to be precise by means of comparison, correlation or plausibility checking of distances, of signal strengths or of pulse shapes of the signals assigned to the channels.

Figure 11A:
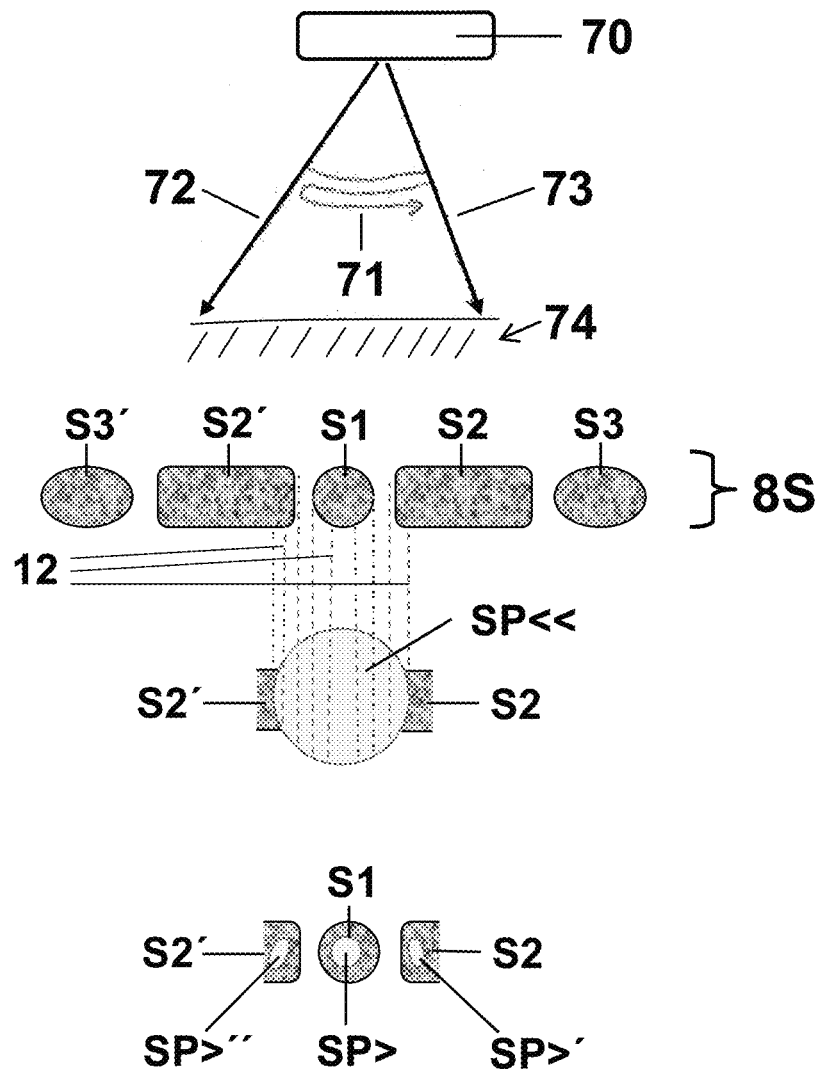
FIG. 11a: shows an illustration of an application of a segmented APD according to the invention in the case of LIDAR for a suppression of a detection of incorrect signals, in particular owing to disturbances resulting from suspended particles, dust or density fluctuations in the case of air movements, in the case of a coaxial arrangement of transmitter and receiver.

FIG. 11*a* shows an illustration of an amplification of a segmented APD 8S according to the invention in the case of LIDAR for suppressing detection of incorrect signals, in particular owing to disturbances resulting from suspended particles 71 as a result of air movements, in the case of a coaxial arrangement of transmitter and receiver.

Primarily in the case of very powerful lasers having an average transmission power of more than 1 watt, problems can occur as a result of back-reflection of airborne emission beams 72, 73 at aerosols 71, but also at clouds and dust particles. These light-scattering suspended particles can cause an erroneous trigger, also designated as "air targets". If the propagation time from an aircraft 70 to the actual target is shorter than the laser pulse interval, then only a single light pulse is in the air. In the case of such settings, the receiver can be inactivated to be blind for example over the first 500 m for a distance to a target object (here ground 74) by means of a window technique, such that a detection of the "air targets" is suppressed. Nowadays, however, the laser shot rate is much higher. Thus, during a measurement interval there are in each case a plurality of pulses between transmitter and receiver, and, since the pulses can impinge on the receiver at any time, a receiver-end time windowing, as described above, cannot be used. A comparable problem area is also known in mining—in particular in opencast mining—where the pit slopes are monitored over a number of kilometers through dusty air by means of LIDAR instruments.

A segmented APD 8S according to the invention enables a solution to this problem. In the case of coaxial systems, impulses that are to be assigned to the aerosols in each case impinge predominantly on the innermost APD segment S1 and to a lesser extent on more peripherally arranged APD segments S2, S2', S3 and S3'. As a result, it is possible to identify and mask out pulses from short distances, for example from an apparent distance of up to 500 m.

The circle bearing the reference sign SP<<shows a light spot generated by a near target object. A coarse distance can be derived by a size estimation of the light spot by means of a signal comparison of the inner three APD segments S1, S2 and S2'. Light spots from large distances SP>, SP>' and SP>" are smaller and predominantly irradiate only a single APD segment and can be identified as a result.

Figure 11B:
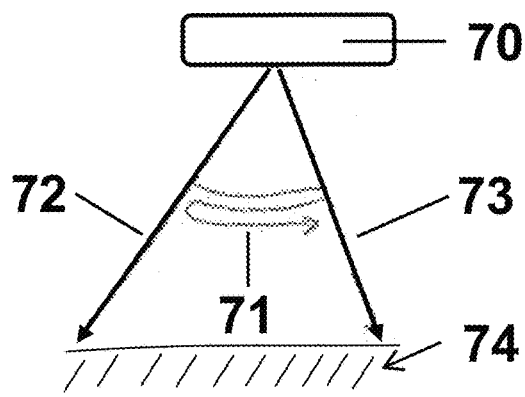
FIG. 11b: shows an illustration—analogous to FIG. 11a—of an application of a segmented APD according to the invention in the case of LIDAR for a suppression of a detection of incorrect signals, in particular owing to disturbances resulting from suspended particles, dust or density fluctuations in the case of air movements, in the case of a biaxial arrangement of transmitter and receiver.
Figure 11B:
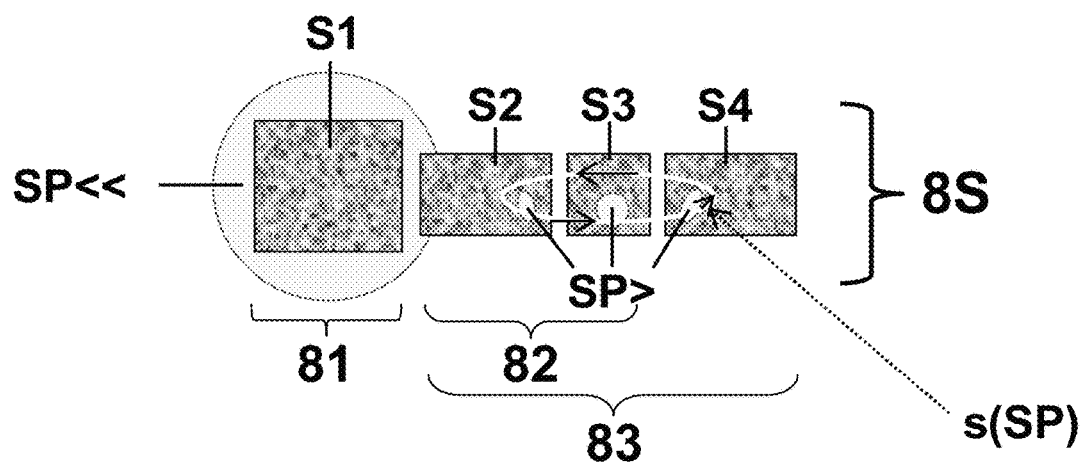

FIG. 11*b* shows an illustration—analogous to FIG. 11*a*—of an application of a segmented APD according to the invention in the case of LIDAR for suppressing a detection of erroneous signals, in particular owing to disturbances resulting from suspended particles in the case of air movements, in the case of a biaxial arrangement of transmitter and receiver. The optical axis of the receiver is situated at the APD segment S3. In order to receive objects at short distances, a first APD segment S1 is provided, the latter being designed such that the correspondingly large received light spots SP<<but also desired air targets such as backscattering at clouds are measured from a distance of less than 500 m distance (81). The further three APD segments S2, S3 and S4 are provided for object targets at medium distances to distances larger than 500 m; in this case, the light spot oscillates synchronously with the mirror movement of the scanner across the three APD segments. In this case, "s(SP)" identifies the track of the received light spot on the reception segments S2, S3 and S4 owing to the movement of the scanner mirror, wherein these segments are provided for medium distances (for example the segments S2 and S3) and for larger distances (for example the segments S3 and S4). The track of the received light spot lies primarily in the region 82 in the case of medium distances and in the region 83 in the case of long distances. In order to reduce the influence of disturbing ambient light, the segments assigned to longer distances are preferably of smaller area than those which receive signals from short distances.

It goes without saying that these illustrated figures merely illustrate possible exemplary embodiments schematically. The various approaches can be combined both with one another and with apparatuses and methods from the prior art.

What is claimed is:

1. An electrooptical distance measuring device comprising:
   a light source for emitting at least one light signal as transmission light beam onto a target object;
   a reception circuit comprising a detector comprising a photosensitive reception component for receiving the light signal backscattered from the target object as reception light beam; and
   a control and evaluation component for deriving a distance to the target object,
   wherein:
   the reception component has at least two mutually independent reception segments for mutually independently generating a respective resultant electrical signal, wherein the reception segments are assigned to predefined or predefinable different distance ranges to be measured,
   at least two independent amplifiers are provided in the context of the reception circuit for the at least two reception segments,
   an amplifier having a comparatively high gain factor is provided for a reception segment of at least two reception segments which is assigned to an upper distance range of comparatively far distances, and
   an amplifier having a comparatively low gain factor is provided for a reception segment of the at least two reception segments which is assigned to a lower distance range of comparatively near distances.

2. The distance measuring device according to claim 1, wherein the light source comprises a laser light.

3. The distance measuring device according to claim 1, wherein the detector comprises a PIN diode or avalanche photodiode APD.

4. The distance measuring device according to claim 1, wherein the two independent amplifiers have different gain factors.

5. The distance measuring device according to claim 1, wherein:
the transmission light beam is substantially collimated, that is to say has at most a divergence of 0.5°, specifically of 0.01°, and
a focusing optical unit having a fixed focus is disposed upstream of the detector, wherein the detector is positioned in the focal plane of the focusing optical unit.

6. The distance measuring device according to claim 1, wherein:
the reception segments are embodied and arranged such that light signals backscattered from the different distance ranges illuminate different defined reception segment combinations.

7. The distance measuring device according to claim 1, wherein:
the mutually independent reception segments do not overlap and are in each case spaced apart from one another, wherein the mutually independent reception segments are arranged in a radially distributed fashion, especially in a concentric-circular fashion.

8. The distance measuring device according to claim 1, wherein:
a dedicated signal processing path is assigned to each reception segment in the context of the reception circuit, wherein the electronic signals are fed in each case to a dedicated analog-to-digital converter.

9. The distance measuring device according to claim 1, wherein the dedicated signal processing path is separate in each case for different reception segments.

10. The distance measuring device according to claim 1, wherein:
mutually different signal processing paths are separately electronically drivable and/or readable, wherein signals from different reception segments are readable from assigned different signal paths in a manner distinguishable from one another.

11. The distance measuring device according to claim 1, wherein:
the dimensioning of reception segments and of the gain in the associated signal paths is coordinated with one another and also with the respective return light signals to be expected from different distance ranges for a minimization of a resultant variation between strong and weak signals as signal dynamic range and/or magnification of a signal-to-noise ratio for the individual signal paths.

12. An electrooptical distance measuring device comprising:
a light source for emitting at least one light signal as transmission light beam onto a target object;
a reception circuit comprising a detector comprising a photosensitive reception component for receiving the light signal backscattered from the target object as reception light beam; and
a control and evaluation component for deriving a distance to the target object,
wherein:
the reception component has at least two mutually independent reception segments for mutually independently generating a respective resultant electrical signal, wherein the reception segments are assigned to predefined or predefinable different distance ranges to be measured,
at least two independent amplifiers are provided in the context of the reception circuit for the at least two reception segments,
at least one reception segment is dimensioned and arranged such that a light signal backscattered from a target object situated in the near range and having—as viewed in a reception plane—a beam cross section having a comparatively large diameter and comparatively large central shading is receivable, and
wherein the reception segment is embodied in an annular fashion or in an annulus-segment-shaped fashion and has an outer circle diameter of at least 200 µm, specifically of at least 500 µm.

13. The distance measuring device according to claim 1, wherein the near range comprises a range less than 5 m.

14. The distance measuring device according to claim 1, wherein the distance measuring device is provided for a distance measurement to be regarded as static—as far as a movement of transmission and/or reception components of the distance measuring device is concerned—and the transmission light beam and the reception light beam run coaxially with respect to one another,
wherein:
the mutually independent reception segments are arranged in a radially distributed fashion, specifically in a concentric-annular fashion, and/or
dedicated reception segments are adapted in terms of their dimensioning for the reception of large-area reception light spots SP for a determination of short distances to a target object.

15. The distance measuring device according to claim 1, wherein the distance measuring device is provided for a distance measurement to be regarded as dynamic—as far as a movement of transmission and/or reception components of the distance measuring device is concerned—, wherein the transmission light beam is rapidly rotated about at least one rotation axis during operation, and the transmission light beam and the reception light beam run coaxially with respect to one another,
wherein:
the mutually independent reception segments are arranged in an axially symmetrically radially distributed fashion, specifically in a concentric-annular fashion or in a concentric-annulus-segment-shaped fashion, wherein the reception segments—with regard to their respective ring radius and their dimensioning—are positioned and embodied depending on a provided defined movement of transmission and/or reception components of the distance measuring device.

16. The distance measuring device according to claim 1, wherein:
the transmission light beam and the reception light beam run biaxially with an offset with respect to one another and at least one of the at least two reception segments is arranged axially asymmetrically.

17. The distance measuring device according to claim 1, wherein:
the control and evaluation component is designed for the diversion of coarse distance information on the basis of a determination of which of the reception segments present generates a respective electrical signal, and read-out of the distance range assigned to the determined combination of illuminated reception segments, specifically wherein a signal strength distribution among the illuminated reception segments is also determined and used for the derivation of the coarse distance information, wherein the control and evaluation component uses the respectively derived coarse distance information in the context of a pulse time-of-flight distance measurement for resolving an ambiguity that arises in the assignment of transmission and reception pulses, specifically for solving a multiple-pulses-in-the-air problem.

18. An electrooptical distance measuring method comprising:

emitting a light signal as transmission light beam onto a target object;

receiving and detecting a portion of the emitted light signal that returns from the target object as reception light beam; and determining a distance to the target object;

wherein:

receiving and detecting are carried out within at least two mutually independent reception segments for mutually independently generating a respective resultant electrical signal, wherein the reception segments are assigned to predefined or predefinable distance ranges to be measured, and the mutually independently generated electrical signals are amplified independently of one another, wherein an amplifier having a comparatively high gain factor is provided for a reception segment of at least two reception segments which is assigned to an upper distance range of comparatively far distances, and wherein an amplifier having a comparatively low gain factor is provided for a reception segment of the at least two reception segments which is assigned to a lower distance range of comparatively near distances.

19. The electrooptical distance measuring method according to claim 18, wherein determining a distance to the target object occurs in the millimeter or submillimeter range.

20. The electrooptical distance measuring method according to claim 18, wherein:

the electrical signals generated by the different reception segments independently of one another are read from respectively assigned different signal paths in a manner distinguishable from one another, wherein coarse distance information is determined from the comparison of the generated signals, specifically wherein when a LIDAR system is used—the determined coarse distance information is used to prevent a distance determination with respect to incorrect targets by predefined or predefinable minimal distances being excluded, and/or wherein—when a pulse time-of-flight measurement principle is used—the determined coarse distance information is used to resolve an ambiguity that possibly arises in the assignment of transmission and reception pulses.

* * * * *